(12) United States Patent
Nakashima

(10) Patent No.: US 9,727,980 B2
(45) Date of Patent: Aug. 8, 2017

(54) INSPECTION METHOD

(71) Applicant: NuFlare Technology, Inc., Yokohama (JP)

(72) Inventor: Kazuhiro Nakashima, Kanagawa (JP)

(73) Assignee: NuFlare Technology, Inc., Yokohama (JP)

( * ) Notice: Subject to any disclaimer, the term of this patent is extended or adjusted under 35 U.S.C. 154(b) by 216 days.

(21) Appl. No.: 14/837,347

(22) Filed: Aug. 27, 2015

(65) Prior Publication Data

US 2016/0070971 A1    Mar. 10, 2016

(30) Foreign Application Priority Data

Sep. 4, 2014   (JP) ................. 2014-180693

(51) Int. Cl.
| | |
|---|---|
| *G06K 9/46* | (2006.01) |
| *G06K 9/52* | (2006.01) |
| *G06K 9/62* | (2006.01) |
| *G06T 7/00* | (2017.01) |
| *G06T 7/73* | (2017.01) |
| *G01R 31/00* | (2006.01) |
| *H01L 21/66* | (2006.01) |

(52) U.S. Cl.
CPC ............. *G06T 7/74* (2017.01); *G01R 31/00* (2013.01); *G06T 7/001* (2013.01); *G06T 7/0044* (2013.01); *G06T 2207/10056* (2013.01); *G06T 2207/30148* (2013.01); *H01L 22/12* (2013.01)

(58) Field of Classification Search
CPC .................................................. G06T 7/0044
USPC ......................................................... 348/87
See application file for complete search history.

(56) References Cited

U.S. PATENT DOCUMENTS

| | | | |
|---|---|---|---|
| 2011/0058160 A1* | 3/2011 | Tan ...................... | G01N 21/896 356/237.2 |
| 2013/0044205 A1* | 2/2013 | Matsumoto ............. | G06K 9/00 348/86 |
| 2013/0216120 A1* | 8/2013 | Inoue .................... | G06T 7/0004 382/144 |

FOREIGN PATENT DOCUMENTS

| | | |
|---|---|---|
| JP | 2005-235777 | 9/2005 |
| JP | 2009-192345 | 8/2009 |
| JP | 2013-40873 | 2/2013 |
| JP | 2013-167608 | 8/2013 |

* cited by examiner

*Primary Examiner* — Christopher S Kelley
*Assistant Examiner* — Asmamaw G Tarko
(74) *Attorney, Agent, or Firm* — Oblon, McClelland, Maier & Neustadt, L.L.P.

(57) ABSTRACT

In an inspection method, an inspection region of a sample is divided into a plurality of stripe regions, and is divided into a plurality of groups so that a plurality of continuously arranged stripe regions constitutes one group. An optical image of a graphic pattern arranged in a stripe region of one of the groups is acquired while moving a stage in a longitudinal direction of the stripe region. The stage is then moved in a lateral direction of the stripe region. An optical image of a graphic pattern arranged in a stripe region of a group different from one of the groups in which the optical image is acquired, and in a stripe region not continuous to the stripe region whose optical image is acquired immediately before the movement in the lateral direction, is acquired while moving the stage in the longitudinal direction of the stripe region.

20 Claims, 14 Drawing Sheets

INSPECTION METHOD

CROSS-REFERENCE TO THE RELATED APPLICATION

The entire disclosure of the Japanese Patent Application No. 2014-180693, filed on Sep. 4, 2014 including specification, claims, drawings, and summary, on which the Convention priority of the present application is based, are incorporated herein in its entirety.

FIELD OF THE INVENTION

The present invention relates to an Inspection Method.

BACKGROUND

With high integration and large capacity of a Large Scale Integration (LSI), a circuit dimension required for a semiconductor element has become increasingly narrowed.

Recently, EUV (Extreme Ultraviolet) lithography and nanoimprint lithography (NIL) have attracted attention as technologies for forming fine patterns on a semiconductor wafer.

In the EUV lithography, a pattern formed in a mask is transferred onto a resist film formed on a wafer by an exposure apparatus by illuminating extreme ultraviolet light. On the other hand, in the nanoimprint lithography, the fine pattern is transferred on the resist film by pressuring a template having a fine pattern of a nanometer-scale fine structure to a resist film formed on a wafer. In both EUV lithography and the nanoimprint lithography, a pattern formed in the EUV mask and the template that is an original plate, is finer when compared with ArF lithography using an exposure apparatus by illuminating ArF light. Therefore, in an inspection process for a mask used for EUV lithography, and in an inspection process for a template used for nanoimprint lithography, high inspection accuracy is required to detect a defect.

In the mask inspection process, a pattern region of the mask is virtually divided into a plurality of strip-shaped stripe regions, and an optical image of a pattern is acquired by scanning inspection light on each stripe region in a longitudinal direction. The scanning by the inspection light is actually performed by a movement of a stage on which a mask is placed. Then, the existence or non-existence of a defect of a pattern in each stripe region is examined using the acquired optical image. The acquisition of the optical image is continuously performed. When one stripe region is scanned by the inspection light, an adjacent stripe region is then scanned. With this process repeated, the inspection is performed such that the entire pattern region is scanned. In addition, the same process is also applied to a case where the inspection target is a template. Specific examples of the inspection method are disclosed in, for example, JP2013-40873, JP2005-235777, and JP2009-192345.

One of the important items to consider in the defect determination in the inspection of the mask or the template is a misplacement of the pattern. In order to obtain a misplacement amount of the pattern, it is necessary to measure an accurate position of the pattern. In practice, this is obtained by measuring position coordinates of a stage on which the mask or the template is placed. For example, the misplacement amount of the pattern is obtained by obtaining position coordinates of the pattern from a measurement value of the position coordinates of the stage and a positional relationship between the stage and the mask, and obtaining a misplacement amount between the obtained position coordinates of the pattern and design coordinates of the pattern. In this case, the position coordinates of the stage is measured by a laser interferometer provided in an inspection apparatus.

The laser interferometer is an apparatus that measures the position coordinates of the stage by laser light, emitted from a laser head, incident to a stage mirror fixed to the stage, or by reflecting laser light emitted from a laser head from a stage mirror fixed to the stage. As described above, since the position coordinates on the mask can be known from the position coordinates of the stage measured by the laser interferometer, and the positional relationship between the stage and the mask, the position coordinates of the pattern formed in the mask are obtained from the above position coordinates.

Incidentally, in the laser interferometer, a wavelength of the laser light is a reference when a distance is measured. The wavelength of the laser light is changed according to a refractive index of a medium through which the laser light propagates. In the case of the laser interferometer used for measuring the position coordinates of the stage in the inspection apparatus, the medium through which the laser light propagates is air and the refractive index thereof is changed according to atmospheric pressure or temperature change. If the refractive index is changed, the wavelength of the laser light is changed and the measurement value is changed. Therefore, the position coordinates of the stage cannot be accurately obtained. As a result, the accurate position coordinates of the pattern formed in the mask or the template cannot be obtained.

Therefore, it may be considered that the atmospheric pressure or the temperature is monitored by an atmospheric pressure sensor or a temperature sensor, and a measurement error occurring due to a wavelength change caused by these changes is corrected. However, it is difficult to sufficiently reduce the measurement error through only such correction. This problem is particularly severe in an inspection target requiring high inspection accuracy, such as a mask in EUV lithography or a template in nanoimprint lithography. A solution to this problem is therefore urgently needed.

The present invention has been made in view of the above-mentioned problems. That is, an object of the present invention is to provide an inspection method that can perform inspection by accurately measuring position coordinates of an inspection target.

Other challenges and advantages of the present invention are apparent from the following description.

SUMMARY OF THE INVENTION

According to one aspect of the present invention, an inspection method includes placing a sample on a stage of an inspection apparatus. A plurality of graphic patterns are arranged in the sample.

An inspection region of the sample is divided into a plurality of stripe regions. The inspection region is divided into a plurality of groups so that a plurality of continuously arranged stripe regions constitutes one group.

Optical images of graphic patterns arranged in all stripe regions are acquired while measuring position coordinates of the stage using a laser interferometer. The step for acquiring optical images of graphic patterns arranged in all stripe regions includes acquiring an optical image of a graphic pattern arranged in a stripe region of one of the groups while moving the stage in a longitudinal direction of the stripe region. The stage is then moved in a lateral direction of the stripe region. An optical image of a graphic pattern arranged in a stripe region of a group different from one of the groups in which the optical image is acquired, and in a stripe region not continuous to the stripe region whose optical image is acquired immediately before the movement in the lateral direction, is acquired while moving the stage in the longitudinal direction of the stripe region.

The position coordinates of the graphic pattern are obtained from a measurement value of the position coordinates of the stage, the optical image of the graphic pattern, and a reference image generated from design data of the graphic pattern. A misplacement amount between the optical image and the reference image is obtained based on the position coordinates of the graphic pattern. First misplacement information of a relationship between the misplacement amount and an acquiring order of optical images is obtained.

Second misplacement information that is an approximate curve of the first misplacement information is obtained.

Third misplacement information that is a difference between the first misplacement information and the second misplacement information is obtained.

Fourth misplacement information of a relationship between a misplacement amount in the third misplacement information and design position coordinates obtained from the design data is obtained.

According to another aspect of the present invention, an inspection method includes placing a sample on a stage of an inspection apparatus. A plurality of graphic patterns are arranged in the sample.

An inspection region of the sample is divided into a plurality of stripe regions. The inspection region is divided into a plurality of groups so that a plurality of continuously arranged stripe regions constitutes one group;

Optical images of graphic patterns arranged in all stripe regions are acquired while measuring the position coordinates of the stage using a laser interferometer and measuring a temperature of the stripe region. The step for acquiring the optical images of graphic patterns arranged in all stripe regions includes acquiring an optical image of a graphic pattern arranged in a stripe region of one of the groups while moving the stage in a longitudinal direction of the stripe region. The stage is moved in a lateral direction of the stripe region when the temperature of the stripe region reaches a predetermined temperature. An optical image of a graphic pattern arranged in a stripe region of a group different from one of the groups in which the optical image is acquired, and in a stripe region not continuous to the stripe region whose optical image is acquired immediately before the movement in the lateral direction is acquired while moving the stage in the longitudinal direction of the stripe region.

The position coordinates of the graphic pattern are obtained from a measurement value of the position coordinates of the stage, the optical image of the graphic pattern, and a reference image generated from design data of the graphic pattern. A misplacement amount between the optical image and the reference image is obtained based on the position coordinates of the graphic pattern. First misplacement information of a relationship between the misplacement amount and an acquiring order of the optical images is obtained.

Second misplacement information that is an approximate curve of the first misplacement information is obtained.

Third misplacement information that is a difference between the first misplacement information and the second misplacement information is obtained.

Fourth misplacement information of a relationship between a misplacement amount in the third misplacement information and design position coordinates obtained from the design data is obtained.

According to another aspect of the present invention, an inspection method includes placing a sample on a stage of an inspection apparatus. A plurality of graphic patterns are arranged in the sample.

An inspection region of the sample is divided into a plurality of stripe regions. The inspection region is divided into a plurality of groups so that a plurality of continuously arranged stripe regions constitutes one group.

An optical image of a graphic pattern arranged in one stripe region is acquired while measuring the temperature of the stripe region. The stage is moved in a lateral direction of the stripe region. An optical image of a graphic pattern arranged in a stripe region continuous to the stripe region is acquired while measuring the temperature of the stripe region. A relationship between a time elapsed from the acquisition of the first optical image and a temperature of the stripe region, at the exact time the optical image of the stripe region is acquired, is obtained.

Optical images of graphic patterns arranged in all stripe regions are acquired while measuring position coordinates of the stage using a laser interferometer. The step for acquiring optical images of graphic patterns arranged in all stripe regions includes acquiring an optical image of a graphic pattern arranged in a stripe region in one of the groups until reaching a time when the temperature of the stripe region, at the exact time the optical image of the stripe region is acquired, reaches a predetermined value. The stage is moved in the lateral direction of the stripe region. An optical image of a graphic pattern arranged in a stripe region continuous to the stripe region is acquired. The stage is moved in the lateral direction of the stripe region when a time that the temperature of the stripe region, at the exact time the optical image of the stripe region is acquired, reaches a predetermined value elapses. An optical image of a graphic pattern arranged in a stripe region of a group different from one of the groups in which the optical image is acquired, and in a stripe region not continuous to the stripe region whose optical image is acquired immediately before the movement in the lateral direction is acquired while moving the stage in the longitudinal direction of the stripe region.

The position coordinates of the graphic pattern are obtained from a measurement value of the position coordinates of the stage, the optical image of the graphic pattern, and a reference image generated from design data of the graphic pattern. A misplacement amount between the optical image and the reference image is obtained based on the position coordinates of the graphic pattern. First misplacement information of a relationship between the misplacement amount and an acquiring order of the optical images is obtained.

Second misplacement information that is an approximate curve of the first misplacement information is obtained.

Third misplacement information that is a difference between the first misplacement information and the second misplacement information is obtained.

Fourth misplacement information of a relationship between a misplacement amount in the third misplacement information and design position coordinates obtained from the design data is obtained.

According to another aspect of the present invention, an inspection method includes placing a sample on a stage of an inspection apparatus. A plurality of graphic patterns are arranged in the sample.

A temperature distribution is measured in a lateral direction with respect to a plurality of stripe regions obtained by virtually dividing an inspection region of the sample placed on the stage.

The temperature distribution is divided into primary groups at a predetermined threshold temperature. New groups are generated by shifting a boundary of the primary groups to a boundary of stripe regions positioned adjacent to each other, thereby the stripe regions are divided into the new groups.

Optical images of graphic patterns arranged in all stripe regions are acquired while measuring position coordinates of the stage using a laser interferometer. The step for acquiring optical images of graphic patterns arranged in all stripe regions includes acquiring an optical image of a graphic pattern arranged in a stripe region of one of the groups while moving the stage in a longitudinal direction of the stripe region. The stage is moved in a lateral direction of the stripe region. An optical image of a graphic pattern arranged in a stripe region of a group different from one of the groups in which the optical image is acquired, and in a stripe region not continuous to the stripe region whose optical image is acquired immediately before the movement in the lateral direction is acquired while moving the stage in the longitudinal direction of the stripe region.

The position coordinates of the graphic pattern are obtained from a measurement value of the position coordinates of the stage, the optical image of the graphic pattern, and a reference image generated from design data of the graphic pattern. A misplacement amount is obtained between the optical image and the reference image based on the position coordinates of the graphic pattern. First misplacement information of a relationship between the misplacement amount and an acquiring order of the optical images is obtained.

Second misplacement information that is an approximate curve of the first misplacement information is obtained.

Third misplacement information that is a difference between the first misplacement information and the second misplacement information is obtained.

Fourth misplacement information of a relationship between a misplacement amount in the third misplacement information and design position coordinates obtained from the design data is obtained.

DETAILED DESCRIPTION OF THE EMBODIMENT

First Embodiment

The inspection method according to the first embodiment of the present invention is an inspection method for performing inspection by measuring position coordinates of a sample that is an inspection target and uses, for example, a mask as the sample that is the inspection target. In particular, as the sample that is the inspection target, a mask used in EUV lithography is suitable. However, the inspection target is not limited to the mask. For example, a template used in nanoimprint lithography may be used. The inspection method according to the first embodiment of the present invention, for example, can be performed as follows using the following inspection apparatus.

Figure 1:
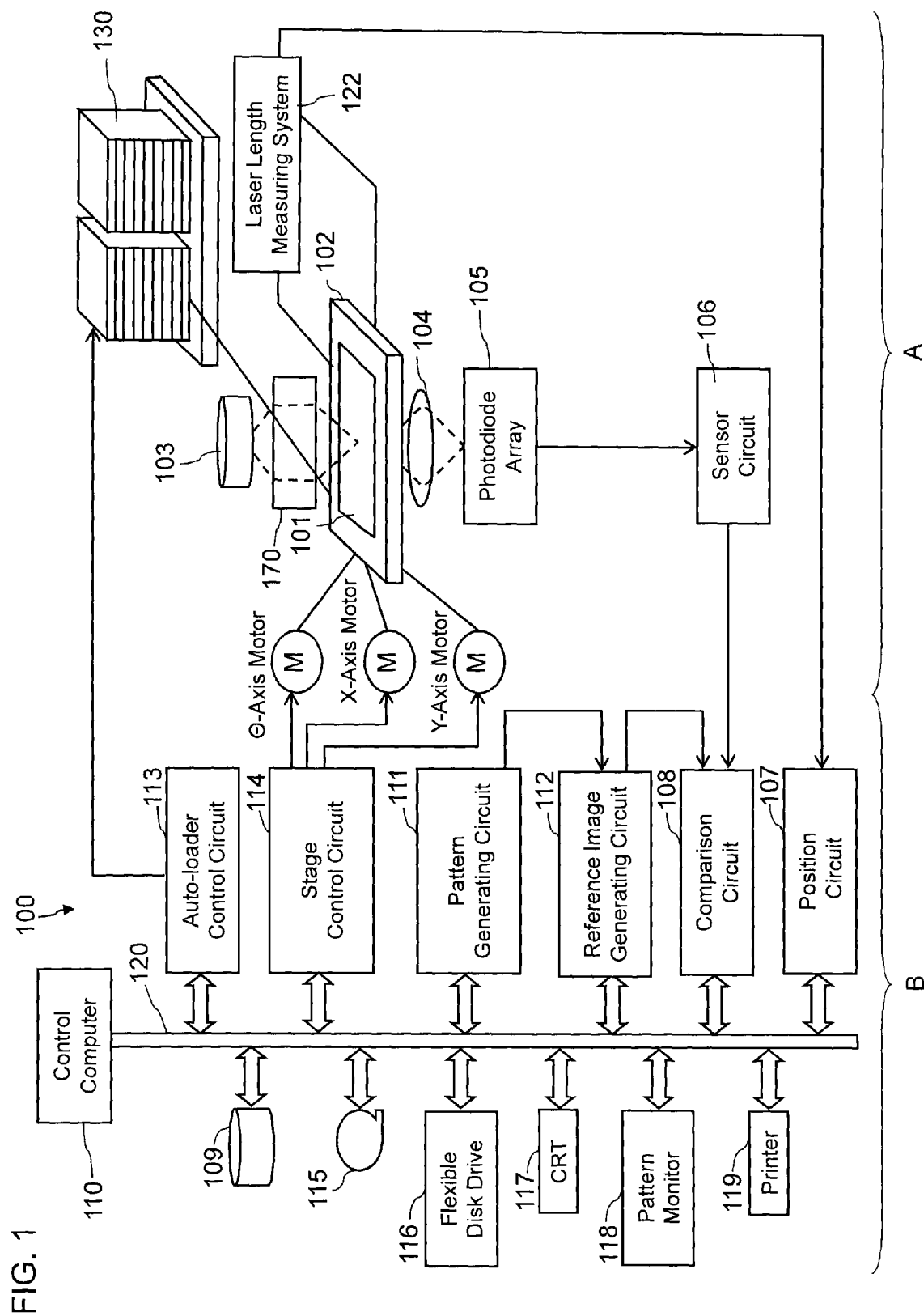
FIG. 1 is a schematic configuration diagram of an inspection apparatus according to the present embodiment.

FIG. 1 is a schematic configuration diagram of an inspection apparatus 100 according to the present embodiment. In FIG. 1, the components necessary in the present embodiment are illustrated. However, other well-known components necessary for an inspection may be included.

As illustrated in FIG. 1, an inspection apparatus 100 includes a configuration unit A that constitutes an optical image acquiring unit, and a configuration unit B that performs processing necessary for an inspection using an optical image acquired by the configuration unit A.

The configuration unit A includes a light source 103, a stage 102 that is movable in a horizontal direction (X-direction and Y-direction) and a rotation direction (θ-direction), an illumination optical system 170 that constitutes a transmission illumination system, a magnifying optical system 104, a photodiode array 105, a sensor circuit 106, a laser length measuring system 122, and an auto-loader 130.

In the configuration unit A, the optical image data 204 of a mask 101 that is an inspection target is acquired. Specifically, the optical image data 204 is an image of a pattern (graphic pattern) of a mask in which a graphic pattern is written based on graphic data included in design pattern data of the mask 101.

The auto-loader 130 positions the mask 101 on the stage 102. Then, the mask 101 is irradiated with a light emitted from the light source 103 through the illumination optical system 170. The light transmitted through the mask 101 is imaged as the optical image on the photodiode array 105 through the magnifying optical system 104.

The magnifying optical system 104 may be configured such that a focal point is automatically adjusted by an automatic focusing mechanism. Further, the inspection apparatus 100 may irradiate the mask 101 with the light from below and guide the light reflected by the mask 101 to the photodiode array 105 through the magnifying optical system.

The photodiode array 105 performs photoelectric conversion on the pattern image of the mask 101 formed on the photodiode array 105, and then the converted light is subjected to A/D (analog-to-digital) conversion by the sensor circuit 106. Thereby, the optical image is, for example, 8-bit unsigned data and is data representing a gradation of brightness of each pixel. A sensor (not illustrated) is provided in the photodiode array 105. A TDI (Time Delay Integration) sensor can be cited as an example of the sensor.

In the configuration unit B, the control computer 110, that is, the controller controlling the whole of the inspection apparatus 100 is connected to a position circuit 107; a comparison circuit 108; a reference image generating circuit 112; a pattern generating circuit 111; an auto-loader controller circuit 113; a stage control circuit 114; a magnetic disk drive 109, a magnetic tape device 115, and a flexible disk drive 116, as examples of a storage unit; a CRT 117; a pattern monitor 118; and a printer 119; through a bus 120 that constitutes a data transmission line.

As used herein, a "unit" or "circuit" can be configured by a program operating on a computer. Alternatively, the "unit" or "circuit" may be constituted by not only the program, that is, for example, software, but also by a combination of software, hardware, or firmware. In the case that the "unit" or "circuit" may be constituted by a program, the program can be stored in a storage unit such as a magnetic disk drive. For example, in the case that the "unit" as shown in FIG. 1 is constituted by the program, the program can be stored in the magnetic disk drive 109. For example, each of the auto-loader control circuit 113, the stage control circuit 114, the pattern generating circuit 111, the reference image generating circuit 112, the comparison circuit 108, and the position circuit 107 may be constituted by an electric circuit, software that can be processed by the control computer 110, or the combination of the electric circuit and software.

The control computer 110 controls the stage control circuit 114. The stage control circuit 114 controls an X-axis motor, a Y-axis motor, and a θ-axis motor to drive the stage 102. For example, an air slider, a linear motor, and a step motor can be used as these driving mechanisms and can further be used in any combination with each other.

A position coordinate of the stage 102 is measured by the laser length measuring system 122. The measurement value is transmitted from the laser length measuring system 122 to the position circuit 107.

Although not illustrated, the configuration of the laser length measuring system 122 is, for example, as follows. The laser length measuring system 122 includes a laser interferometer such as a heterodyne interferometer. In the laser interferometer, the laser light emitted from the laser head is divided into reference light and measurement light by a beam splitter. After that, the reference light is incident on a reference mirror and the measurement light is incident on a mirror attached to the stage 102. Then, light reflected by these mirrors is incident on a light-receiving element such as a CCD. When the light reflected by the reference mirror and the light reflected by the mirror of the stage 102 are superimposed with each other, interference fringes are generated by their optical path difference. By analyzing these, the position coordinates of the stage 102 are obtained. In addition, in the laser length measuring system 122, the X-direction position coordinates of the stage are measured by the laser interferometer that irradiates the laser light toward the mirror provided in the X-axis direction of the stage 102. In addition, the Y-direction position coordinates of the stage are measured by the laser interferometer that irradiates the laser light toward the mirror provided in the Y-axis direction of the stage 102.

The control computer 110 controls the auto-loader control circuit 113 to drive the auto-loader 130. The auto-loader 130 automatically conveys the mask 101, and automatically discharges the mask 101 after the inspection period.

The optical image of the mask 101, which is acquired by the configuration unit A, is transmitted to the configuration unit B, and then, the existence or non-existence of the defect is inspected by comparing the optical image with the reference image generated by the reference image generating circuit 112. The misplacement amount of the pattern is an important item to be considered in defect determination. In particular, as the reduction in the pattern dimension has recently been in progress, it is necessary to perform defect determination in consideration of the misplacement amount of the pattern in the entire surface of the mask. It is necessary to perform inspection by accurately grasping a slight misplacement amount. In addition, it is important to generate a misplacement map by accurately grasping the misplacement amount of the pattern in the mask and provide feedback to the mask manufacturing process.

The misplacement amount of the pattern is obtained by referring to the reference image generated from the design pattern, based on the optical image of the mask 101. Accordingly, next, a method for acquiring the optical image of the mask 101 will be described with reference to the inspection apparatus 100 of FIG. 1. However, before describing the method according to the present embodiment, a method according to comparative example of the present invention will be described.

Figure 2:
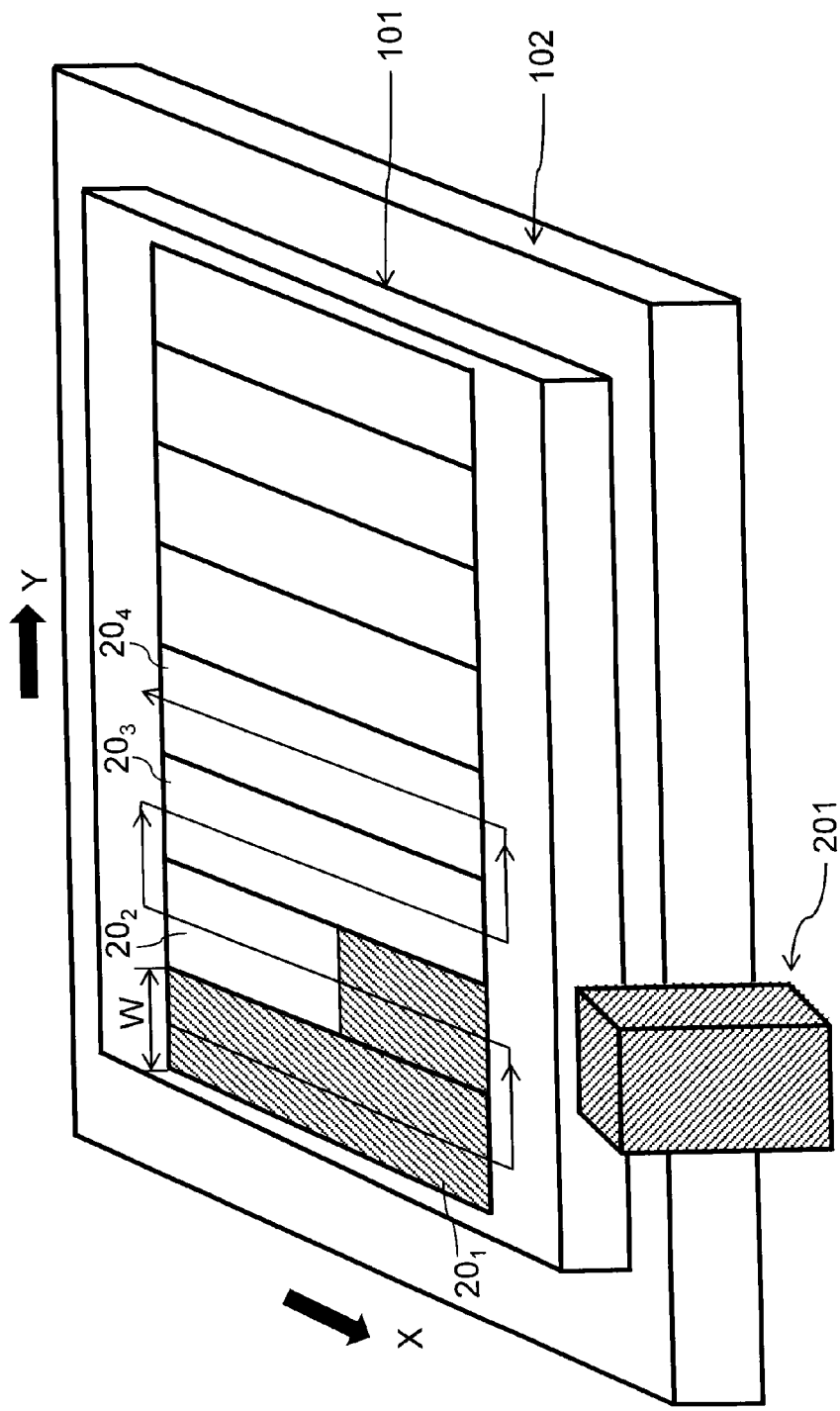
FIG. 2 illustrates a procedure for acquiring the optical image according to the comparative example.

FIG. 2 illustrates the comparative example of a procedure for acquiring the optical image used for the detection of the defect of the pattern formed in the mask 101. In FIG. 2, it is assumed that the mask 101 is positioned on the stage 102 as shown in FIG. 1.

The inspection region of the mask 101 is virtually divided into the strip-shaped multiple inspection regions, namely, stripe regions $20_1$, $20_2$, $20_3$, $20_4$, ... as illustrated in FIG. 2. The width of each stripe region can be a width for imaging the optical image, for example, the width of several hundred micrometers. On the other hand, the length of each stripe region can be the length of about 100 mm corresponding to the total length in the X-direction or Y-direction of the mask 101. In FIG. 2, the X-direction corresponds to a longitudinal direction of each stripe region, and the Y-direction corresponds to a lateral direction of each stripe region.

The optical image is acquired in each stripe region. In the comparative example as shown in FIG. 2, the operation of the stage 102 is controlled such that the each stripe region $20_1$, $20_2$, $20_3$, $20_4$, ... is continuously scanned by the inspection light. For example, when the first stripe region $20_1$ is scanned along the X-direction, the stage 102 is moved to the opposite direction, namely −X-direction. The image having a scan width W is continuously input to the photodiode array 105 along with the movement of the stage 102. Thereby the optical image of the mask 101 is continuously acquired.

According to the comparative example as shown in FIG. 2, the scan by the inspection is started at the first stripe region $20_1$ which is arranged at the end of the inspection region, then the scan is sequentially moves to the neighboring stripe regions such as the second stripe region $20_2$, the third stripe region $20_3$, etc.

Specifically, the optical images of the pattern are acquired in the first stripe region $20_1$, and then the optical images of the pattern are acquired in the second stripe region $20_2$. When the scan of the inspection light is moved from the first stripe region $20_1$ to the second stripe region $20_2$, the stage 102 is moved stepwise along the −Y-direction. Next, the stage 102 is moved in the direction (X-direction) opposite to the direction (−X-direction) in which the image of the first stripe region $20_1$ is acquired. Along with the movement of the stage 102, the image having a scan width W is continuously input to the photodiode array 105 in the second stripe region $20_2$.

After the optical images of the pattern are acquired in the second stripe region $20_2$, the scan of the inspection light is moved to the third stripe region $20_3$. That is, the stage 102 is moved stepwise along the −Y-direction, and then the stage 102 is moved in the direction opposite to the direction (X-direction) in which the image of the second stripe $20_2$ is acquired, namely, the direction (−X-direction) in which the image of the first stripe $20_1$ is acquired. Along with the movement of the stage 102, the image having a scan width W is continuously input to the photodiode array 105 in the third stripe $20_3$.

The same process is repeated even after the optical image of the pattern is acquired in the third stripe region $20_3$, and the scanning is performed up to the stripe region arranged at an opposite end to the first stripe region $20_1$.

An arrow on the stripe region in FIG. 2 indicates the direction and the order in which the optical image is acquired. In addition, a shaded region indicates a region where the acquisition of the optical image has been completed. As shown in the comparative example of FIG. 2, according to the method by which the scanning is started from the stripe region arranged at the end of the inspection region and is sequentially progressed to the adjacent stripe regions, the optical image is efficiently acquired in terms of time. However, as illustrated in FIG. 2, when the heat source 201 is positioned adjacent to the stage 102, the region of the stage 102 that is close to the heat source 201 is thermally affected. In addition, the heat source 201 includes, for example, an objective lens, and an X-axis motor, a Y-axis motor, and a θ-axis motor of the stage 102.

In FIG. 2, the heat source 201 is positioned adjacent to the stripe region on which the scanning is performed by the inspection light. Therefore, while the first stripe region $20_1$ is being scanned, a temperature of the first stripe region $20_1$ is increased by the influence of the heat source 201. In addition, since the influence of the heat source 201 is also exerted on the second stripe region $20_2$ adjacent to the first stripe region $20_1$, a temperature of the second stripe region $20_2$ is also increased. After the scanning of the first stripe region $20_1$ is finished, the stage 102 is moved in the −Y-direction so as to scan the second stripe region $20_2$. Since the second stripe region $20_2$ comes close to the heat source 201, this operation further increases the temperature of the second stripe region $20_2$. After the scanning of the second stripe region $20_2$ is finished, the second stripe region $20_2$ is gradually moved away from the heat source 201, but a considerable time is required until the second stripe region $20_2$ is not affected by the heat source 201. The same is applied to the third stripe region $20_3$, etc. Due to the heat accumulated in each stripe region, the mask 101 undergoes a thermal expansion, and the influence of the increase in the temperature of the mask 101 is exerted on the laser interferometer. Therefore, it is impossible to accurately measure the position coordinates of the pattern of the mask 101. As such, in a case where the inspection region of the mask 101 is sequentially scanned from the end thereof, each stripe region remains adjacent to the heat source 201 for a longer time. Thereby, the above-described problem occurs.

Figure 5:
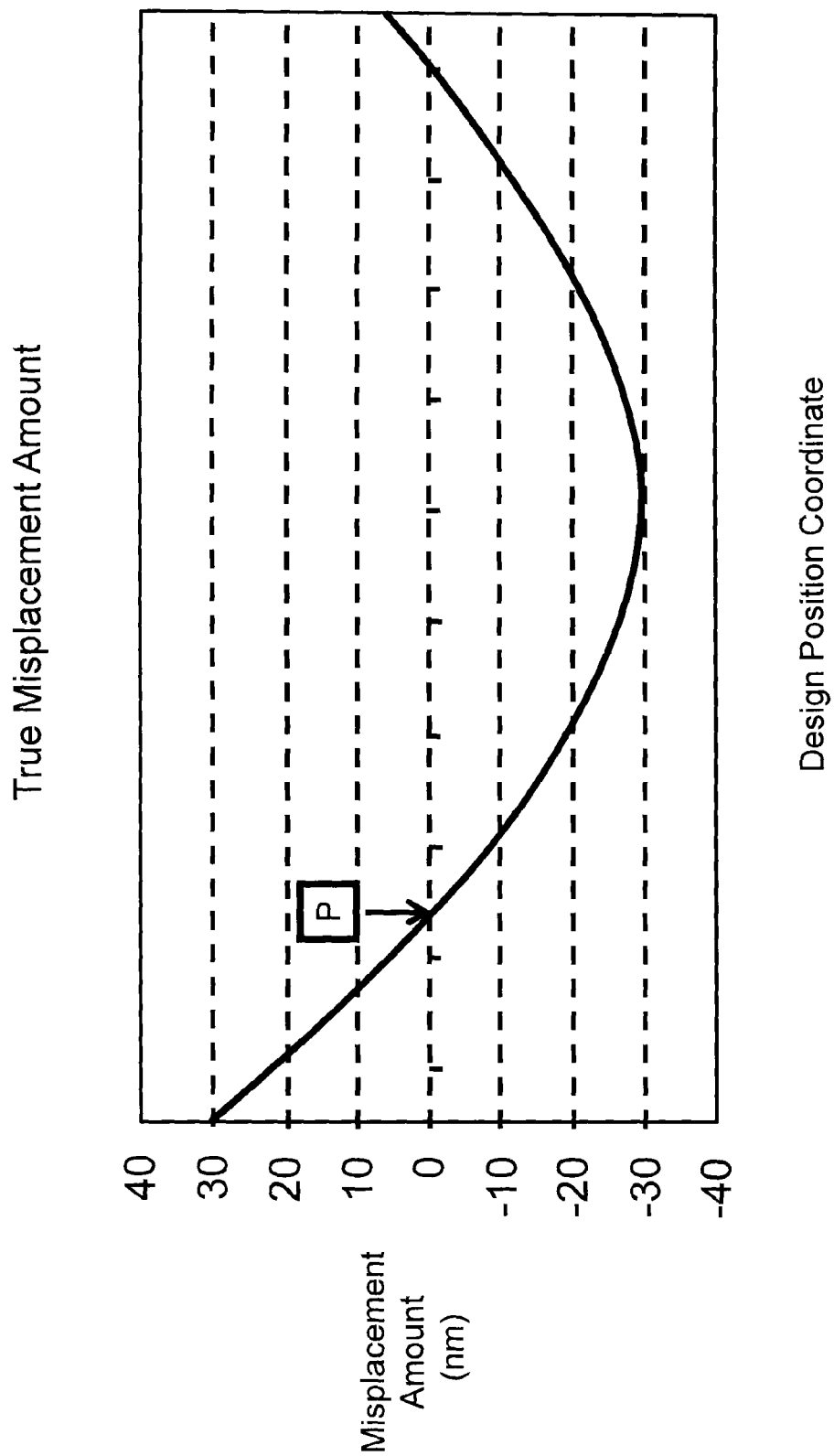
FIG. 5 illustrates the true misplacement amounts of the pattern of the mask.

Next, the change of the measurement value due to the environmental change will be described. FIG. 5 illustrates the misplacement amount from the position coordinates of design data (design position coordinates) of the pattern in each position coordinate of the pattern of the mask 101. It is assumed that the misplacement amount of FIG. 5 is a true misplacement amount including no measurement error.

Figure 6:
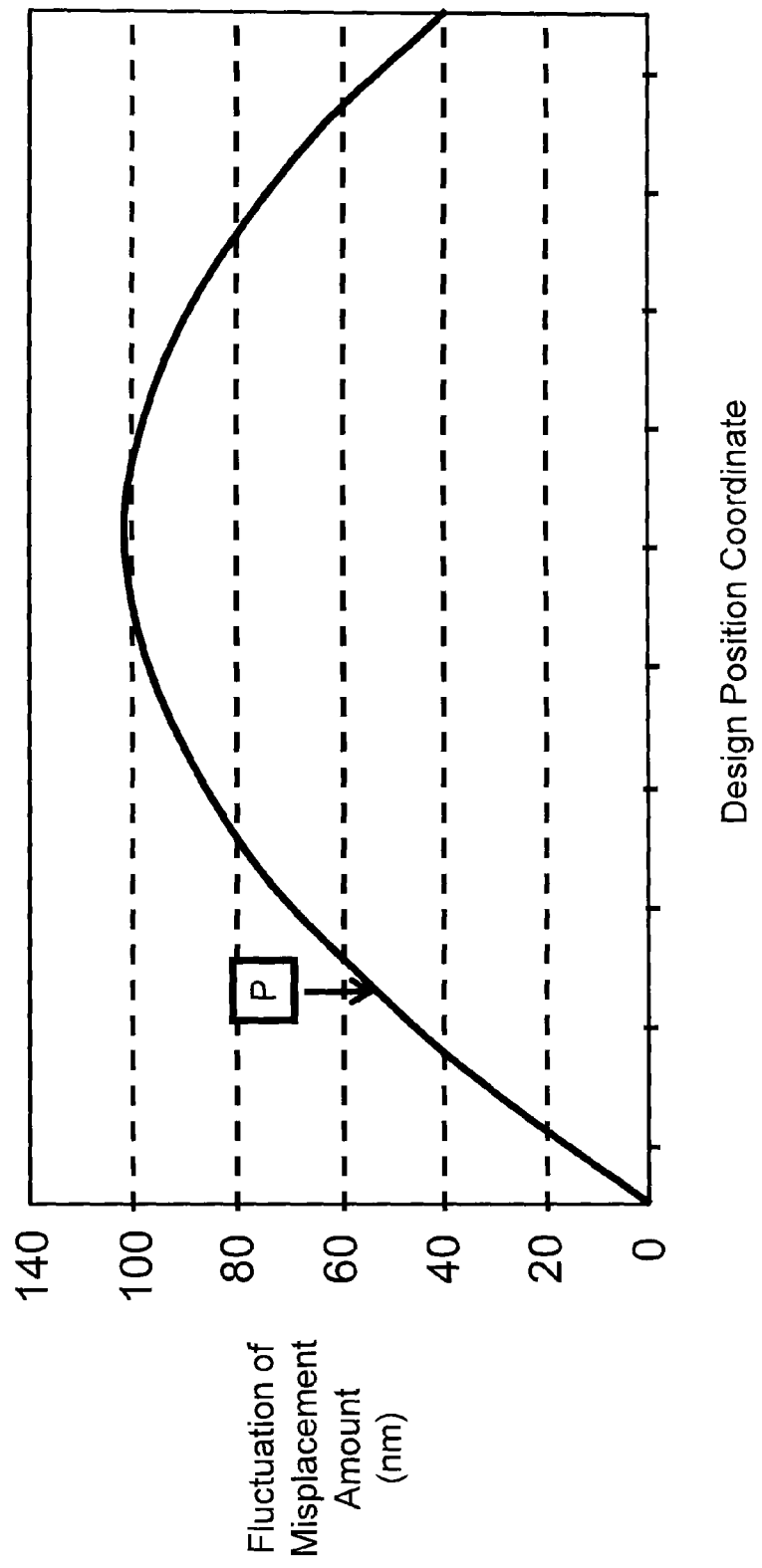
FIG. 6 illustrates the fluctuation in the measurement values of the misplacement amounts according to the comparative example.

In addition, FIG. 6 illustrates the change in the measurement value of the misplacement amount when the pattern of the same mask 101 is scanned according to the method of the comparative example of FIG. 2. That is, FIG. 6 illustrates the change in the measurement value when the misplacement amount of the pattern is measured by acquiring the optical image by the method by which the scanning is started from the stripe region arranged at the end of the inspection region and is sequentially progressed to the adjacent stripe regions. Design position coordinates of a horizontal axis of FIG. 6 are arranged in the measurement order of the position coordinates and correspond to a time axis. The time from the measurement time becomes gradually longer toward the right side of FIG. 6. An environmental change occurring during the measurement includes a temperature increase caused by the irradiation of the inspection light, a pressure change inside the inspection apparatus, and a temperature change outside the inspection apparatus, as well as a temperature increase caused by the influence of the heat source, and the environment is changed by a combination thereof. Therefore, the measurement value of the misplacement amount is changed according to the environmental change when the position coordinates are measured, and the change amount is also changed.

For example, in FIG. 5, since the misplacement amount (true misplacement amount) of the position coordinates P is zero, the position coordinates of the pattern originally match the design position coordinates. However, the measurement value of the position coordinates is changed according to the temperature change or the pressure change in the inspection apparatus. In the example of FIG. 6, the change value of the misplacement amount of the position coordinates P is 55 nm. That is, in this case, the measurement error of 55 nm occurs.

Figure 7:
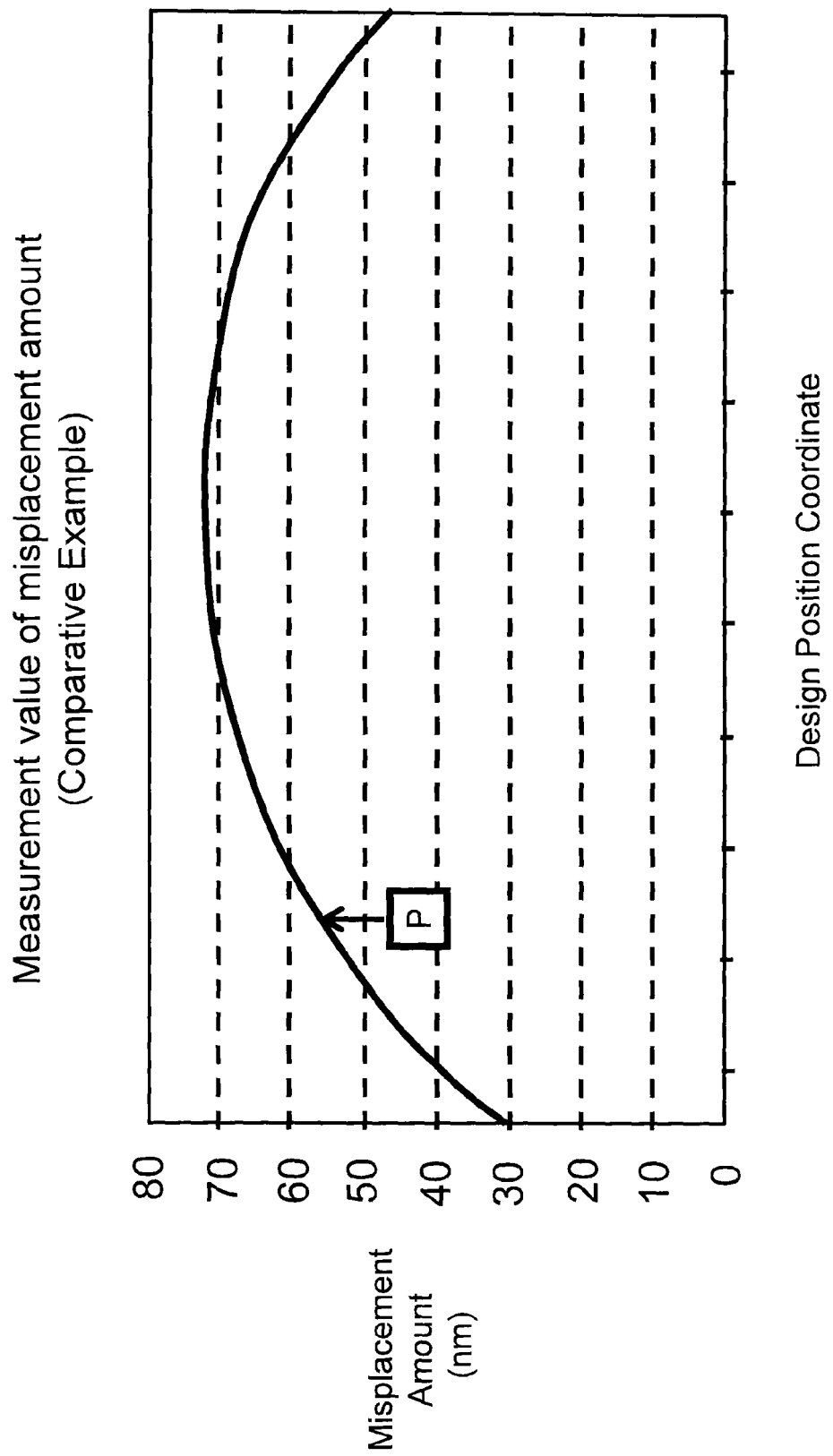
FIG. 7 illustrates the measurement values of the misplacement amounts according to the comparative example.

FIG. 7 is a diagram illustrating the measurement of the position coordinates of the pattern in the mask 101 and the plot of the misplacement amount from the design position coordinates corresponding to each position coordinate as in FIG. 5. Since FIG. 5 represents the true misplacement amount, FIG. 7 should be the same curve as FIG. 5 when the error of the measurement value is included due to the environmental change. However, the influence due to the environmental change illustrated in FIG. 6 acts on the measurement value of FIG. 7. That is, as a result of applying the change amount of FIG. 6 to the misplacement amount of FIG. 5, FIG. 7 is a diagram of a different curve from FIG. 5.

Next, the method for acquiring the optical image of the mask 101 according to the present embodiment will be described.

Figure 3:
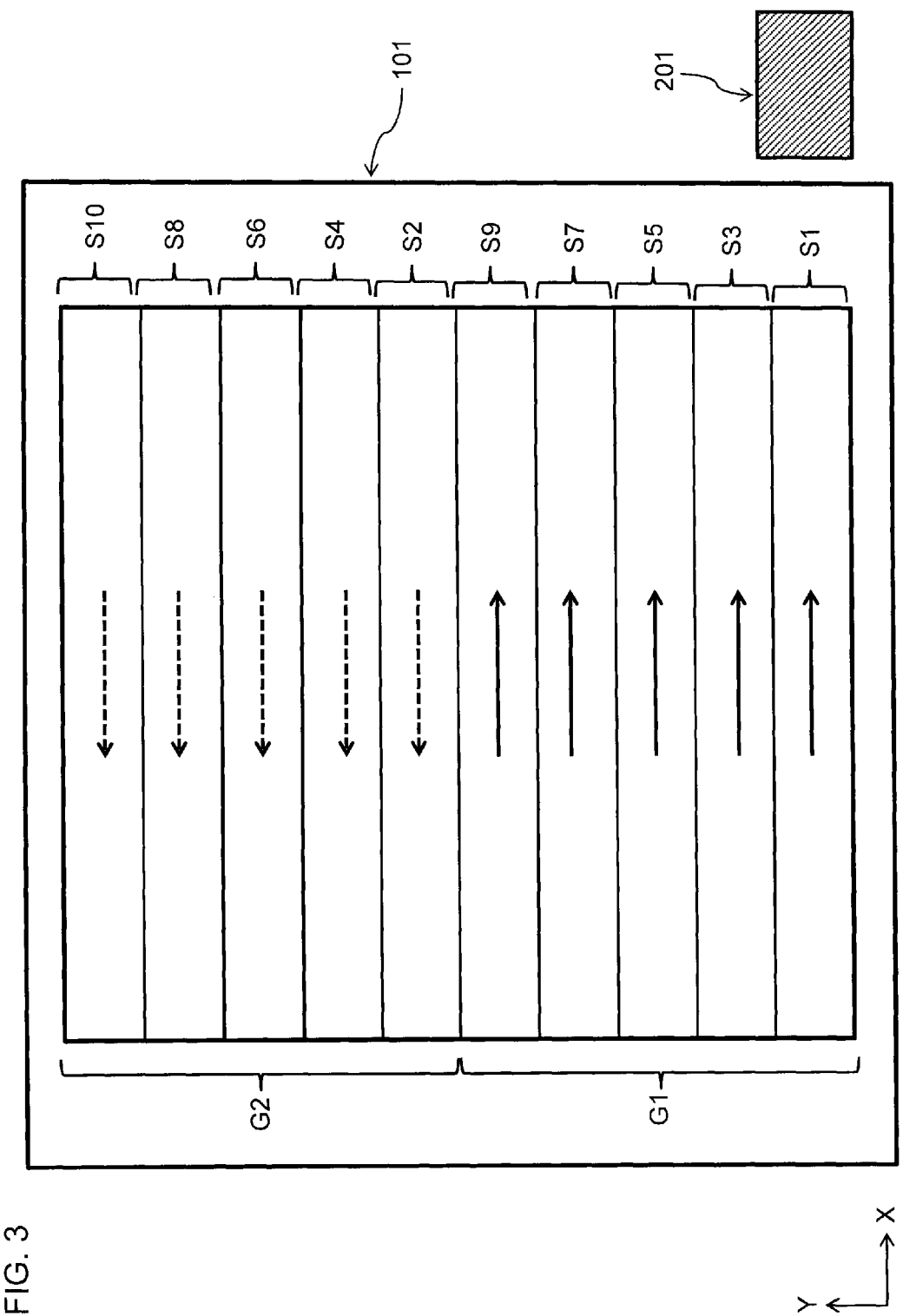
FIG. 3 illustrates one example of a procedure for acquiring the optical image according to the present embodiment.

FIG. 3 is a view illustrating a procedure for acquiring the optical image according to the present embodiment. In FIG. 3, the inspection region of the mask 101 is virtually divided into the stripe regions S1 to S10. Further, these stripe regions are divided into two groups (G1, G2). In addition, the arrow in each stripe region indicates a scanning direction by the inspection light. The X-direction corresponds to a longitudinal direction of each stripe region, and the Y-direction corresponds to a lateral direction of each stripe region.

In the present embodiment, after an optical image of a graphic pattern arranged within the stripe region in one of the groups is acquired while moving the stage in the longitudinal direction of the stripe region, the stage is moved along the lateral direction of the stripe region up to a predetermined position of a different group from this group. Then, in the group of the movement destination, the optical image of the graphic pattern arranged in the stripe region not continuous to the stripe region whose optical image is acquired immediately before the movement in the lateral direction is acquired. According to the procedure of acquiring the optical image as illustrated in FIG. 3, the scanning by the inspection light is moved to the group G2 when one stripe region of the group G1 is completed. Then, when one stripe region of the group G2 is completed, the return to the group G1 is performed again and the operation is repeated.

First, the first stripe region S1 of the group G1 is scanned. Specifically, the optical image in which the first stripe region S1 is scanned in the X-direction is acquired by moving the stage 102 in the −X-direction. After the scanning of the first stripe region Si is completed, the second stripe region S2 of the group G2 scanned by the inspection light comes to the position S1 by moving the stage 102 in the −Y-direction. Then, in the second stripe region S2, the optical image in which the second stripe region S2 is scanned in the −X-direction is acquired by moving the stage 102 in the X-direction.

After the scanning of the second stripe region S2 is completed, the return to the group G1 is performed again and the third stripe region S3 adjacent to the first stripe region S1 is scanned in the same manner as above. Therefore, by moving the stage 102 in the Y-direction, the third stripe region S3 scanned by the inspection light comes to the position S2. Then, the third stripe region S3 is scanned in the X-direction by moving the stage 102 in the −X-direction, thereby the optical image is acquired.

In the example of FIG. 3, in a method of alternately scanning the stripe region belonging to the group G1 and the stripe region belonging to the group G2, when the scanning of one stripe region is completed, the scanning is performed after moving to the distant stripe region. Therefore, it is possible to prevent one stripe region from remaining close to the heat source for a long time.

For example, when the heat source 201 is positioned at a position illustrated in FIG. 3 and this is adjacent to the stripe region on which the inspection is performed, the temperature of the adjacent third stripe region S3 increases while the first stripe region S1 is being scanned. Therefore, when the third stripe region S3 is scanned following the first stripe region S1, the position coordinates of the pattern of the mask 101 cannot be accurately measured by the thermal expansion of the mask 101 due to the temperature increase or the temperature increase of air around the mask. On the contrary, since the stripe region in the group G2 is away from the heat source 201 rather than at least adjacent stripe region with respect to the first stripe region S1, it is less susceptible to thermal influence from the heat source 201 and the temperature of the mask 101 or its surroundings is hardly increased. Therefore, when the second stripe region S2 is scanned following the first stripe region S1, the position can be measured in a state in which the thermal influence by the heat source 201 is reduced.

Next, the temperature of the adjacent fourth stripe region S4 is also increased while the second stripe region S2 is being scanned. After the scanning of the second stripe region S2 is completed, the return to the group G1 is performed again and the third stripe region S3 is scanned. Since the third stripe region S3 is away from the second stripe region S2, the third stripe region S3 is also away from the heat source 201 while the second stripe region S2 is being scanned. Therefore, the third stripe region S3 is less susceptible to thermal influence from the heat source 201 and the temperature of the mask 101 or its surroundings is hardly increased. In addition, the temperature increased while the first stripe region Si is being scanned is lowered while the second stripe region S2 is being scanned. That is, according to the method of alternately scanning the group G1 and the group G2, it is possible to maintain each stripe region below a certain temperature.

A ninth stripe region S9 is also included in the group G1. However, since the ninth stripe region S9 is adjacent to the second stripe region S2, the temperature is increased while the second stripe region S2 is being scanned. Thus, the stripe region that is least susceptible to the heat source 201 in the group G1, that is, the region that is farthest from the second stripe region S2 (in this case, the third stripe region S3), is selected as a next inspection region. The same is applied after the third stripe region S3 is scanned. That is, after the scanning of the stripe regions of the group G1 is completed, the stripe region that is least susceptible to the influence of the heat source 201 while that stripe region is being scanned is selected from the group G2.

As such, after the scanning of one stripe region is completed, the stripe region arranged at a position away from the scanned stripe region is scanned. In this manner, the time when each stripe region remains close to the heat source is reduced, thus reducing the influence of the heat source on the measurement value. That is, when the temperature change occurs in a space from the laser interferometer to the measurement point, the refractive index of the medium (air) through which the laser light propagates is changed. As a result, the wavelength of the laser light is changed and the measurement value is changed. However, according to the method by which, after the scanning of one stripe region is completed, the stripe region arranged away from the scanned stripe region is scanned, the temperature change is suppressed in the space from the laser interferometer to the measurement point. Therefore, it is considered that the change in the measurement value due to the laser interferometer is reduced. In addition, according to the scanning method, since the temperature increase in the stripe region is suppressed, the thermal expansion of the mask 101 can also be reduced and the accurate measurement value of the position coordinates can be acquired.

Figure 4:
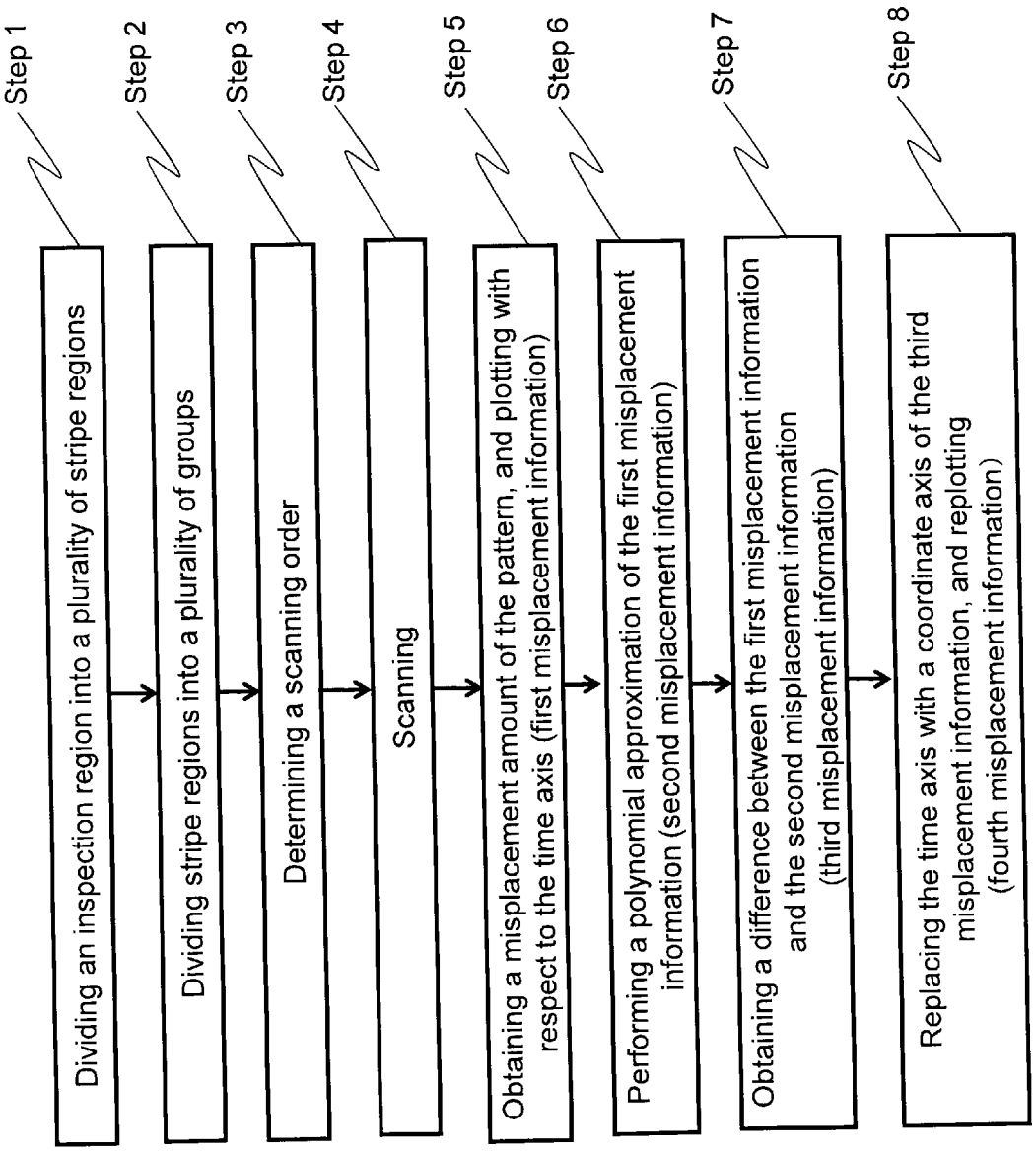
FIG. 4 is a flow chart of the inspection method according to the present embodiment.

FIG. 4 is a flowchart of an inspection method according to a first embodiment of the present invention. The inspection method can be performed using the inspection apparatus of FIG. 1 as described above.

In the inspection method of FIG. 4, first, the inspection region of the mask 101 is divided into a plurality of stripe regions (Step 1). Each stripe region can be a region having a width (capturing width) at which the optical image is captured, and a length corresponding to a length of the mask 101 in the X-direction or the Y-direction.

Subsequently, the plurality of stripe regions is divided into two or more groups (Step 2). In this process, for example, as illustrated in FIG. 3, the plurality of continuously arranged stripe regions can be divided into a plurality of groups. Each of plurality of groups is configured by one or the plurality of continuously arranged stripe regions. When each group is configured by one strip region, the number of groups is three or more. When each group is configured by two or more stripe regions, the number of groups may be two or more.

Figure 13:
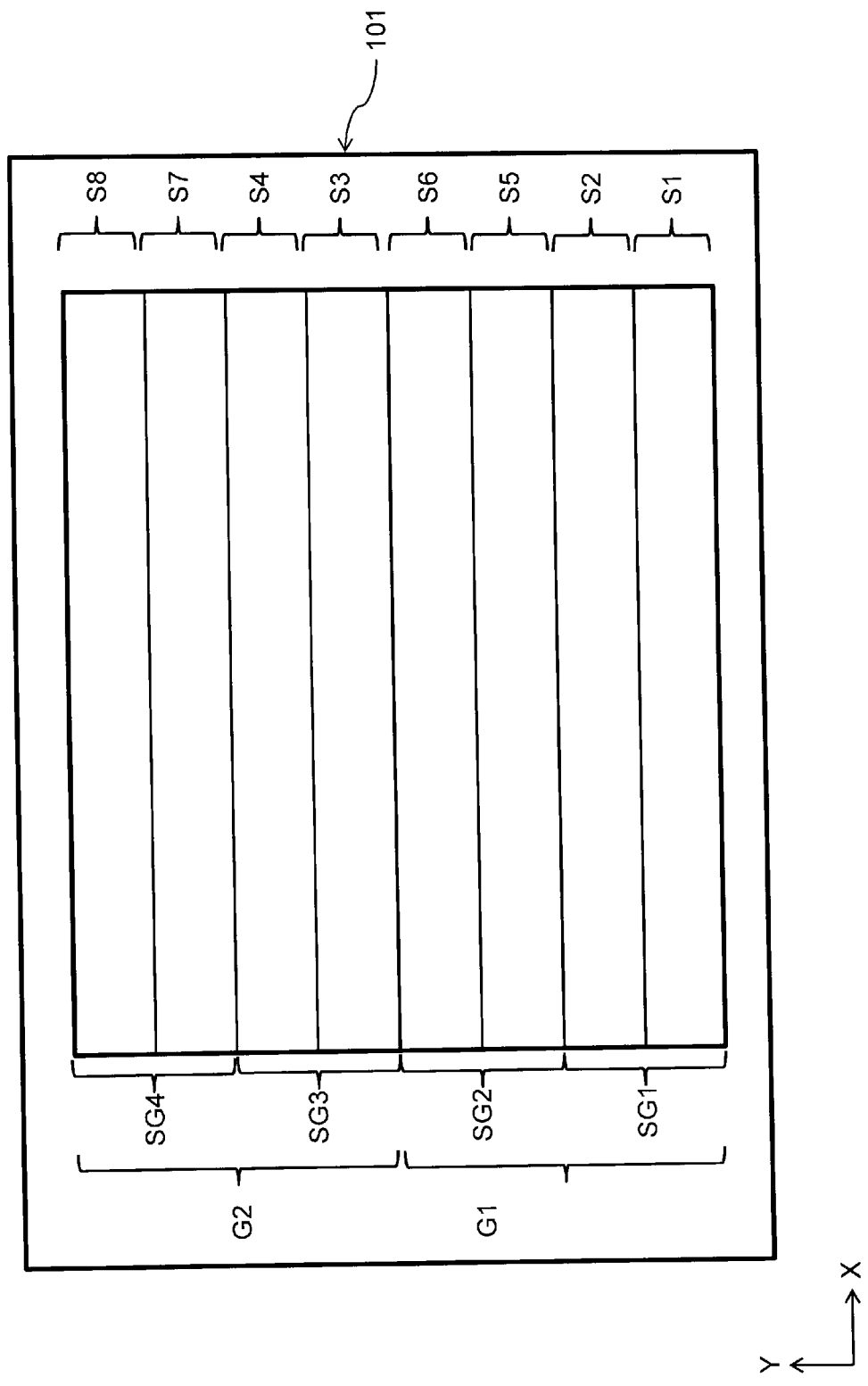
FIG. 13 illustrates the relationship between the group and the sub-group according to the present embodiment.

The grouping can be performed uniformly as in the example of FIG. 3. In this case, as illustrated in FIG. 13, each of the plurality of main groups (G1, G2) dividing the plurality of stripe regions (S1 to S8) may be configured by a plurality of sub-groups (SG1 to SG4) each composed of a predetermined number of stripe region units (in FIG. 13, two stripe region units). This can be rephrased as follows. That is, the inspection region of the mask 101 is divided into a plurality of strip-shaped stripe regions, and furthermore, the plurality of stripe regions is divided into a plurality of groups. Each group has a plurality of stripe regions and these stripe regions are grouped in a predetermined number to constitute sub-groups.

In the present embodiment, the optical image of the graphic pattern arranged within one stripe region in the sub-group of one group is acquired while moving the stage in the longitudinal direction of the stripe region, and the optical images of all the graphic patterns arranged within a predetermined number of stripe regions constituting the sub-group are acquired. After that, the stage is moved to a predetermined position in the sub-group of a different group from the group along the lateral direction of the stripe region. Then, in the sub-group of the movement destination, the optical image of the graphic pattern arranged in the stripe region not continuous to the stripe region whose optical image is acquired immediately before the movement in the lateral direction is acquired.

Next, the scanning order of the stripe regions by the inspection light is determined (Step 3). The stripe region to be first scanned can be arbitrary, but after that, the scanning is sequentially performed from the stripe region that is less susceptible to thermal influence within the inspection apparatus. As described above, since the temperature of the stripe region arranged adjacent to the heat source is easily increased, it is not suitable as a next stripe region to be scanned. In addition, since the temperature increase in the mask 101 due to the irradiation of the inspection light is also considered, it is not preferable to continuously scan the stripe region adjacent to the scanned stripe region even though the stripe region is not arranged adjacent to the heat source. The influence of the heat source or the irradiation of the inspection light is local with respect to the mask 101. Therefore, the stripe region preferable as the next stripe region to be scanned is the stripe region arranged away from the scanned stripe region. Since all the stripe regions are grouped in Step 2, after a scanning of a certain stripe region is completed, a physically separate stripe region can be scanned by selecting a stripe region of a different group from the group to which the scanned stripe region belongs.

Figure 12:
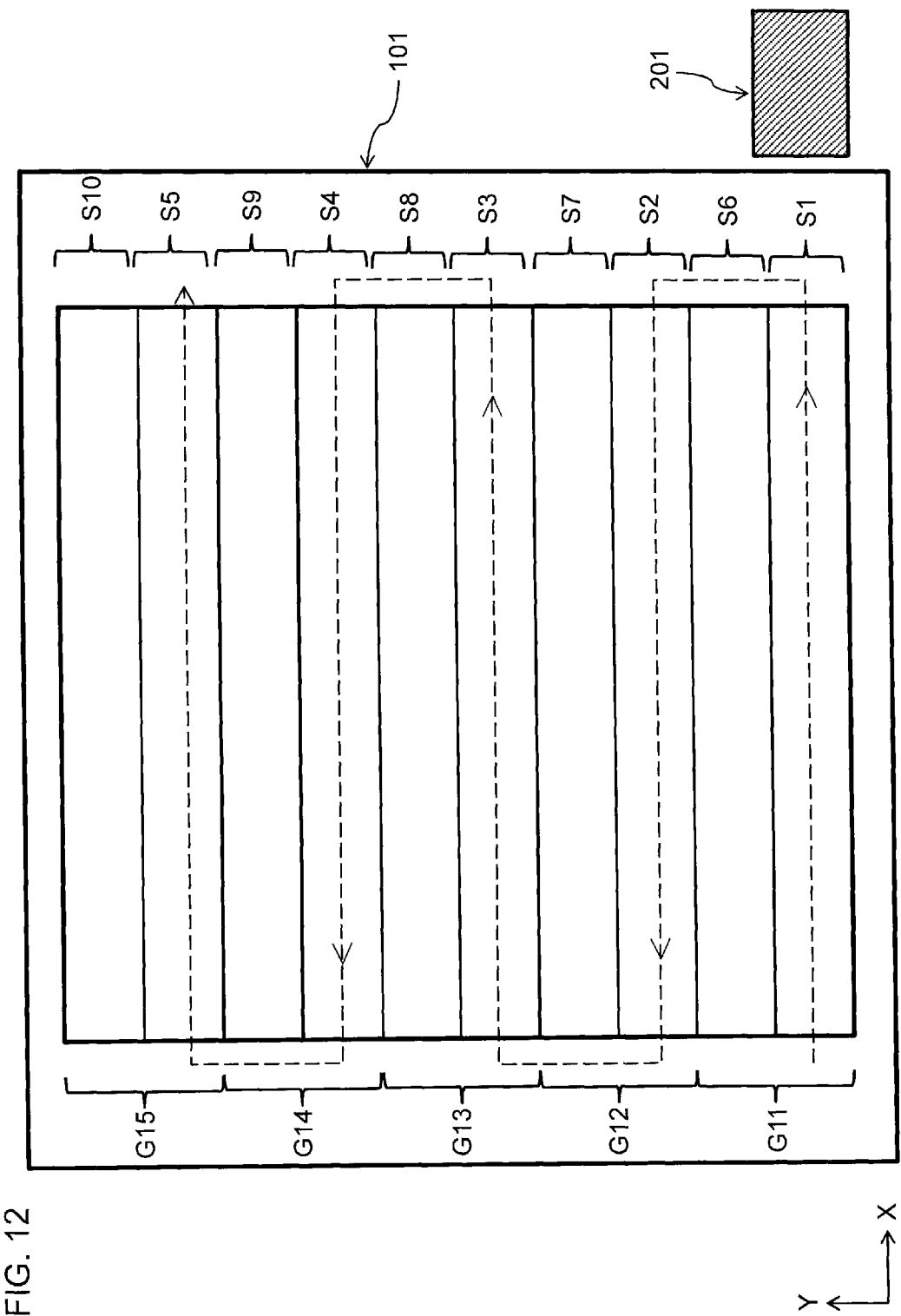
FIG. 12 illustrates another example of the method of scanning the inspection light according to the present embodiment.

FIG. 3 illustrates an example of the method of scanning the inspection light according to the present embodiment. In addition, FIG. 12 illustrates another example of the method of scanning the inspection light according to the present embodiment. In FIG. 12, the stripe regions S1 to S10 are divided into five groups G11 to G15. The arrow within each stripe region indicates the scanning direction by the inspection light. According to the scanning method, the scanning by the inspection light is moved to the stripe region S2 of the group G12 when the stripe region S1 of the group G11 is ended. When the stripe region S2 is ended, the scanning is moved to the stripe S3 of the group G13. In this manner, the scanning is progressed along the direction indicated by the arrows. When the stripe region S5 of the group G15 is completed, the return to the group G11 is performed and the stripe region S6 is scanned. After that, the stripe regions S7, S8, S9, and S10 are scanned in this order.

Subsequently, the stripe region is scanned in the order determined in Step 3, and the optical image of the pattern of the mask 101 is acquired (Step 4). In addition, the position coordinates of the stage 102 are measured by the laser length measuring system 122 in conjunction with the scanning.

Step 4 is a process of acquiring the optical images of all the stripe regions by repeating the following processes (1) and (2).

(1) The optical image of the pattern arranged within the stripe region in one group determined in Step 2 is acquired while moving the stage 102 in the X-direction (or the −X-direction).

(2) Next, by moving the stage 102 in the −Y-direction, the optical image of the pattern arranged within a stripe region in a different group from the group in which the optical image has been acquired in (1) is acquired while moving the stage 102 in the X-direction (or the −X-direction).

After the process (2) is completed, the process returns to the process (1). At this time, in the same group as the above (1), the stripe region from which the optical image is not acquired may be scanned, or the stripe region in a group different from the above (1) (although obvious, a group different from the above (2)) may be scanned.

In Step 4, a timing of moving the group (determined in Step 2) is to move the group for each scanning of each stripe region whenever the scanning of one stripe region is completed, as in the example illustrated in FIG. 3.

Alternatively, in Step 4, a timing of moving the group (determined in Step 2) can be, for example, a timing when the scanning of a predetermined number of stripe regions is completed. In this case, the "predetermined number" is equal to or greater than 1 and is equal to or less than a total number of stripe regions constituting the group. In the example of FIG. 3, the predetermined number is 1, that is, the group is moved whenever the scanning of one stripe region is completed.

In addition, in the example of FIG. 13, a timing of moving from the group G1 to the group G2 can be, for example, a timing when the optical images of all patterns are acquired in the stripe regions (S1, S2) constituting one sub-group SG1 in the group G1.

In the present embodiment, for example, after Step 1 to Step 3 are performed by the inspection apparatus 100, information related to the stripe region, the group, and the scanning order can be input to the magnetic disk drive 109, and the control computer 110 can read the information and control the stage control circuit 114. The stage control circuit 114 controls the movement of the stage 102 so that each stripe region is scanned in the determined order.

When the scanning of all the stripe regions is completed, the misplacement amount of the pattern in the mask 101 is acquired. In the inspection apparatus 100, the optical image data from the sensor circuit 106, the reference image data from the reference image generating circuit 112, and the measurement value of the position coordinates of the stage 102 from the position circuit 107 are transmitted to the misplacement amount acquisition circuit provided in the comparison circuit 108. In the misplacement amount acquisition circuit, each process of Step 5 to Step 8 of FIG. 4 is performed and the misplacement amount of the pattern of the mask 101 is acquired.

First, first misplacement information is obtained based on the data transmitted to the misplacement amount acquisition circuit (Step 5). This process is specifically performed as follows.

By scanning each stripe region in Step 4, the optical image of the pattern of the mask 101 is acquired. The photodiode array 105 performs photoelectric conversion on the light incident on the photodiode array 105, and the sensor circuit 106 performs A/D (analog-to-digital) conversion. Thereby, optical image data which is 8-bit data with no code, and expresses a gradation of brightness of each pixel, is required.

The position coordinates of the pattern of the mask 101 are acquired from the optical image data and the measurement value of the position coordinates of the stage 102. For example, the optical image data acquired in units of stripes is divided into small regions, called blocks (or frames). Then, a predetermined region of the optical image is compared with a reference image generated from the design data corresponding to the predetermined region. The stage 102 is moved parallel to a position at which an absolute value of a difference value of these images, or, the sum of squares of the difference, is minimized by pattern matching. The position coordinates of the pattern of the mask 101 are determined from the parallel moving amount at this time and the data of the laser length measuring system 122 that is recorded in the block.

Subsequently, regarding the position coordinates of the pattern of the mask 101, the misplacement amount from the design coordinates are obtained. The misplacement amount is a value at which the absolute value of the difference value between the optical image and the reference image, or the sum of squares of the difference, is minimized.

Subsequently, the misplacement amount obtained in the above is plotted with respect to the time axis. That is, the misplacement amount is plotted in the measured order. Therefore, the first misplacement information is obtained.

Figure 8:
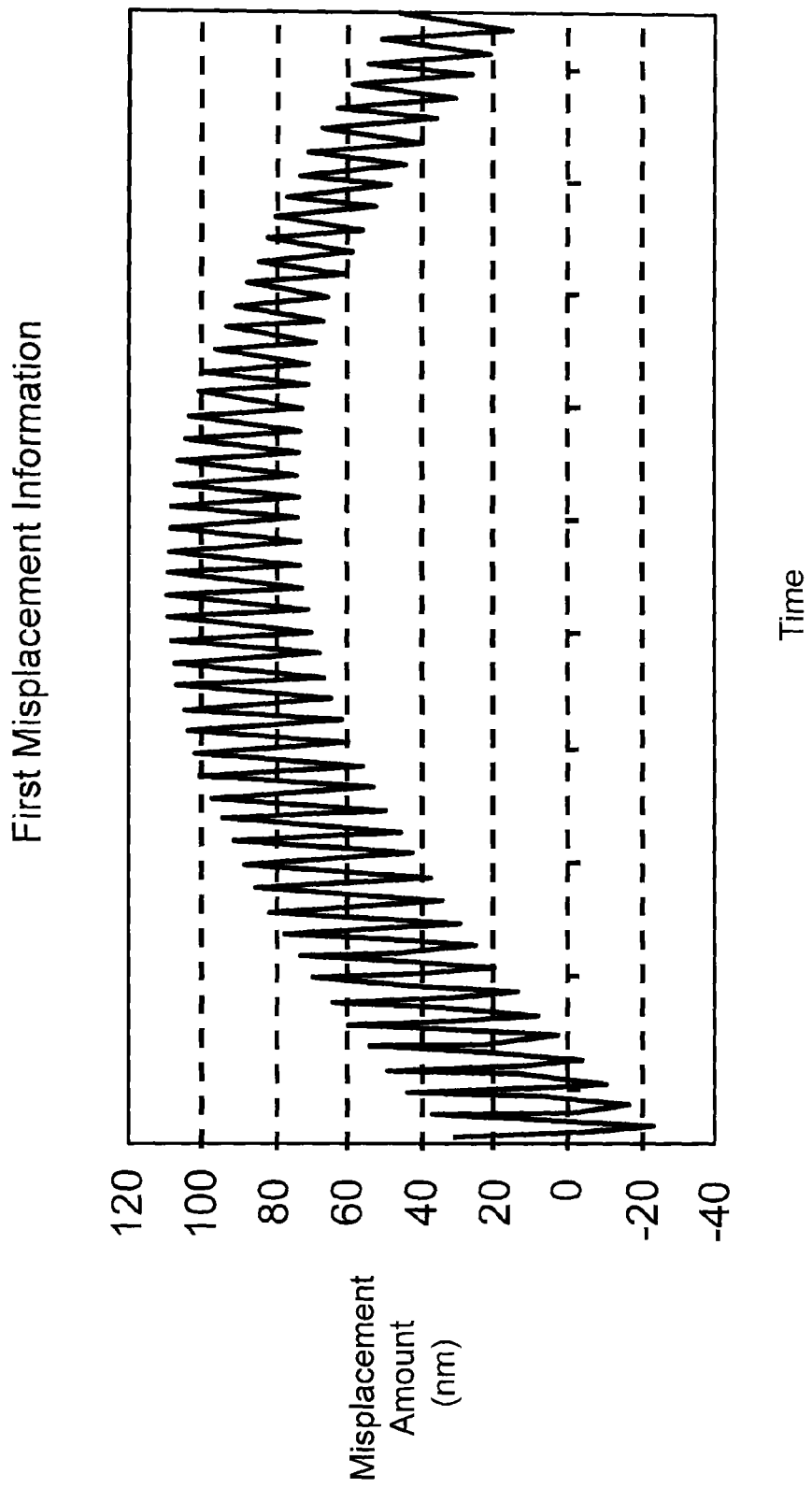
FIG. 8 illustrates an example of the first misplacement information.

FIG. 8 illustrates an example of the first misplacement information. According to the present embodiment, after the scanning of one stripe region is completed, the stripe region arranged at a position away from the scanned stripe region is scanned. Therefore, it is possible to suppress the change in the misplacement amount that occurs due to the temperature increase caused by the heat source or the irradiation of the inspection light.

As described with reference to FIGS. 5 to 8, according to the method of the comparative example in which the scanning is started from the stripe region arranged at the end of the inspection region and is sequentially progressed to the adjacent stripe regions, the measurement value of the misplacement amount is changed and the change amount is also changed, according to the environmental change occurring during the measurement of the position coordinates of the stage 102 using the laser length measuring system 122. As the environmental change, there is also a pressure change in the inspection apparatus, as well as the temperature increase caused by the influence of the heat source or the temperature increase caused by the irradiation of the inspection light. In the method of scanning the inspection light according to the present embodiment, it is possible to reduce the local environmental change caused by the heat source or the irradiation of the inspection light and the change spread therefrom and applied to the mask 101.

On the other hand, as described above, since the environmental change includes a non-local change, it is necessary to correct a measurement error caused by such a non-local environmental change so as to acquire an accurate measurement value. Thus, a method for correcting the measurement error will be described.

The first misplacement information obtained in the present embodiment is a measurement value obtained in a state in which the influence of the local environmental change is reduced. That is, the first misplacement information may be regarded as information in which the change amount of the misplacement amount due to the environmental change common to each stripe region is added to the true misplacement amount. Examples of the environmental change common to each stripe region include a pressure change in the inspection apparatus or a temperature change that affects the entire mask 101.

Figure 9:
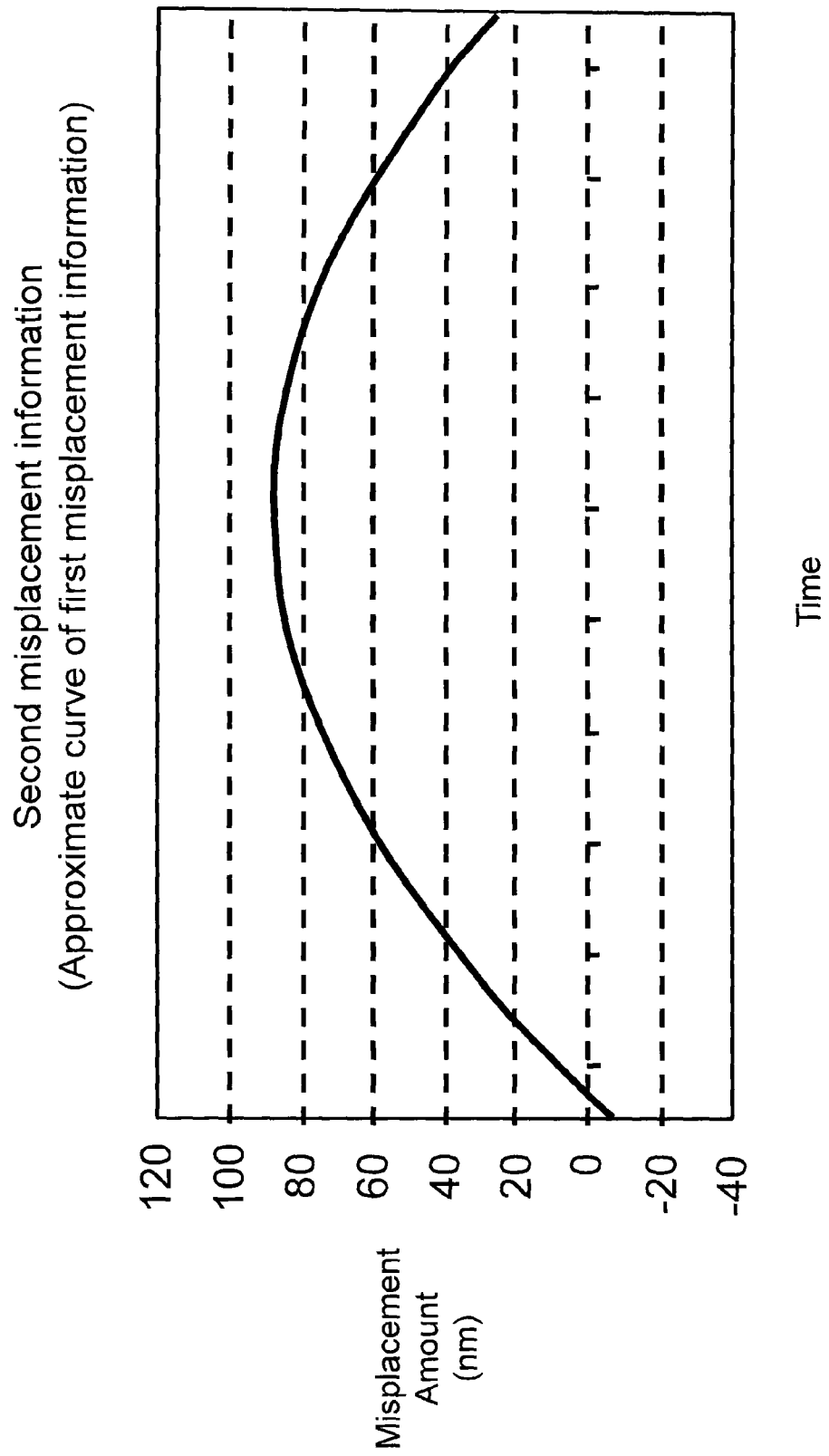
FIG. 9 illustrates the second misplacement information that is obtained by a polynomial approximation of the first misplacement information.

Subsequently, an approximate curve of the first misplacement information (second misplacement information) is obtained (Step 6). FIG. 9 illustrates the second misplacement information that is obtained by a polynomial approximation of the first misplacement information illustrated in FIG. 8. The second misplacement information indicates the misplacement amount due to the environmental change common to each stripe region.

In addition, the second misplacement information may be obtained by calculating a time-axis moving average value, without being limited to the polynomial approximation. Alternatively, in the drawing of the first misplacement information, the information is divided into blocks in the time axis and the average value may be obtained with respect to each block by a cubic spline interpolation. Furthermore, in the diagram of the first misplacement information, the information is divided into blocks in the time axis and the misplacement amount of the reference points is obtained by the polynomial approximation with respect to each block, and the cubic spline interpolation may be performed between the reference points.

Figure 10:
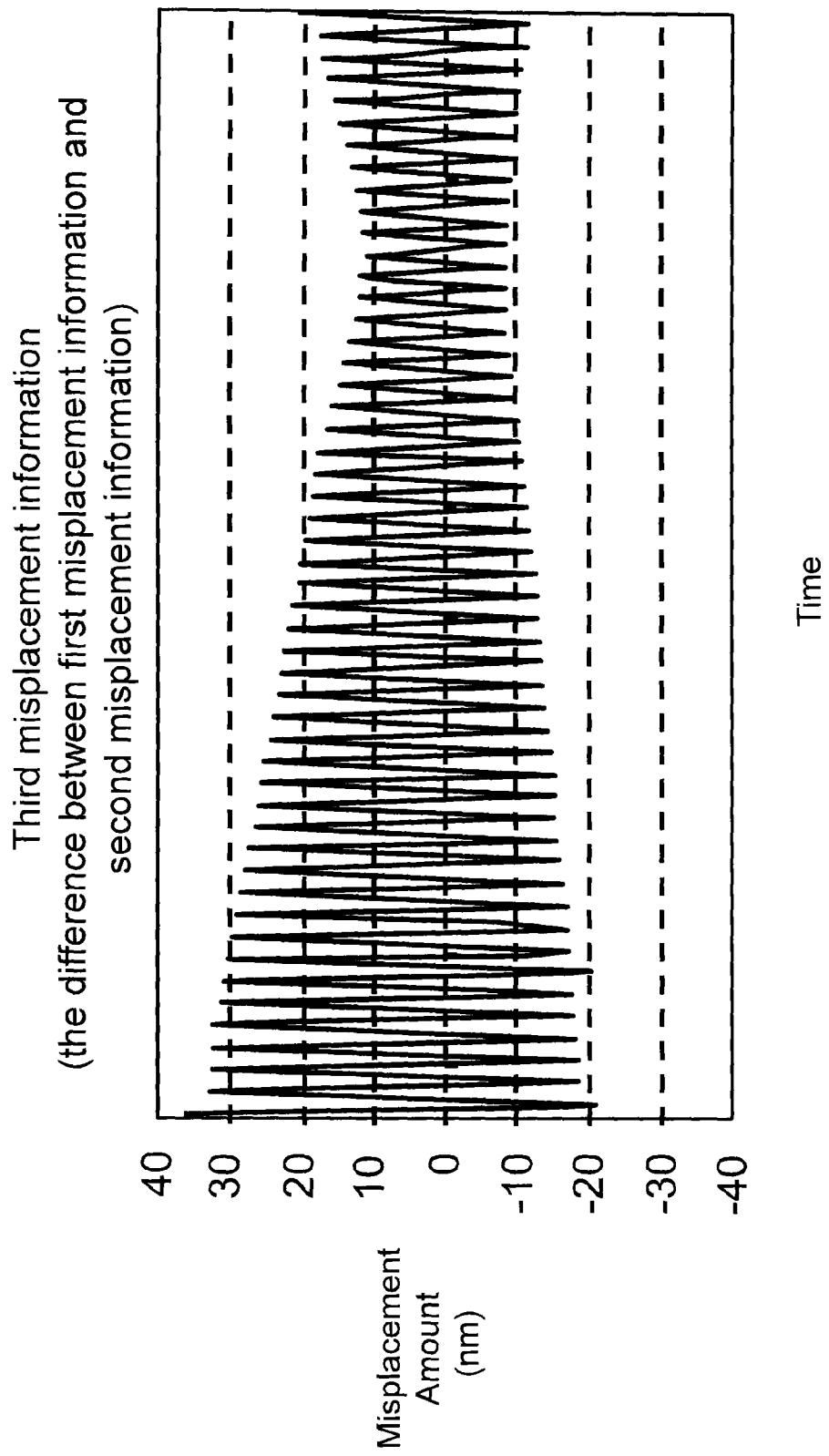
FIG. 10 illustrates the third misplacement information.

Subsequently, a difference between the first misplacement information and the second misplacement information is obtained (Step 7). As described above, the first misplacement information may be regarded as information in which the change amount of the misplacement amount due to the environmental change common to each stripe region is added to the true misplacement amount. The second misplacement information is a misplacement amount due to the environmental change common to each stripe region. Therefore, third misplacement information corresponding to the true misplacement amount is obtained by calculating the difference between the first misplacement information and the second misplacement information. FIG. 10 illustrates the third misplacement information.

Figure 11:
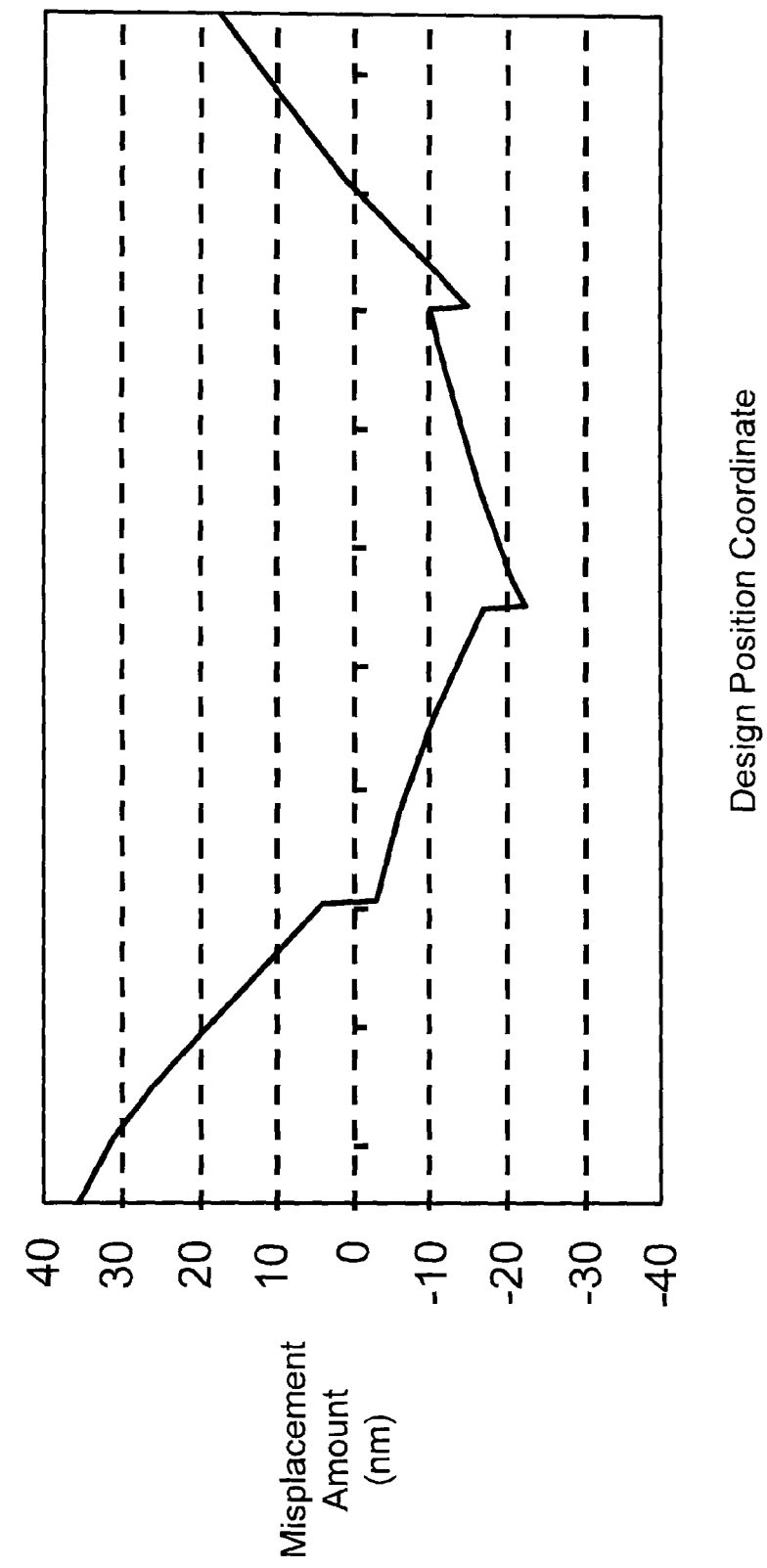
FIG. 11 illustrates fourth misplacement information in which the third misplacement information is plotted with respect to the design position coordinates.

Since the third misplacement information is plotted with respect to the time axis, it is re-plotted in place of the coordinate axis (Step 8). FIG. 11 is a diagram of fourth misplacement information in which the third misplacement information of FIG. 10 is plotted with respect to the design position coordinates. The fourth misplacement information corresponds to the true misplacement amount with respect to the coordinate axis. Therefore, when compared with FIG. 5 representing the true misplacement amount including no measurement error, it can be seen that FIG. 11 illustrates a similar shape to FIG. 5. On the contrary, FIG. 7 representing the misplacement amount obtained through the scanning by the method of the comparative example of FIG. 2 has a quite different shape from FIG. 5. That is, according to the scanning method of the present embodiment, the accurate position coordinates are obtained by reducing the error when the position coordinates of the pattern of the inspection target. Therefore, the accurate misplacement amount can be obtained.

The fourth misplacement information can be used in the defect inspection of the mask 101. As described above, this represents the accurate misplacement amount of the pattern of the mask 101. Therefore, in recent years when the miniaturization of the pattern dimension is in progress, an accurate inspection result can be derived even under the situation that it is necessary to perform the defect determination in consideration of the change in the misplacement amount of the pattern in the entire mask. In addition, since an accurate misplacement map of the mask 101 can be generated from the fourth misplacement information, the manufacturing yield of the mask can be improved by feeding back this to the manufacturing process.

The misplacement map of the mask 101 can be generated in, for example, the comparison circuit 108. Specifically, the comparison circuit 108 plots the misplacement amount in association with the position coordinates on the mask 101 using the fourth misplacement information and the measurement value of the position coordinates of the stage 102 transmitted from the position circuit 107. In this way, the misplacement map of the mask 101 can be generated.

As an example, the entire measurement pattern is divided into a plurality of unit regions wherein each unit region includes a predetermined region, and a plurality of regions that are arranged adjacent to the predetermined region and wherein each region is the same size as the predetermined region. Subsequently, the misplacement amount is obtained with respect to each unit region. The misplacement amount is a value at which the absolute value of the difference value between the predetermined region of the optical image of the measurement pattern and the reference image corresponding to the predetermined region, or the sum of squares of the difference, is minimized. In addition, with respect to the plurality of regions that is arranged adjacent to the predetermined region and has the same size as the predetermined region, the value at which the absolute value of the difference value between the optical image and the reference image corresponding to the optical image, or the sum of squares of the corresponding difference, is minimized is obtained with respect to each region. Subsequently, the average value of these values is obtained, and the map is generated using the average value as the average misplacement amount of each unit region. The unit region can be, for example, a frame.

In addition, the misplacement map generation unit is provided separately from the comparison circuit 108. The misplacement amount from the comparison circuit 108 and the measurement value of the position coordinates of the stage 102 from the position circuit 107 may be transmitted to the misplacement map generation unit, and the misplacement map may be generated by the misplacement map generation unit.

Subsequently, a method for generating the reference image data serving as the reference when obtaining the misplacement amount of the pattern will be described. The reference image data is used as the reference image in the die-to-database comparison.

The reference image data is generated from the design data of the pattern that is the inspection target within the inspection apparatus 100 of FIG. 1 as follows.

CAD data 301 produced by a designer (user) is converted into design intermediate data 302 having a hierarchical format such as OASIS. The pattern data (design pattern data), that is produced in each layer and formed in the mask 101, is included in the design intermediate data.

The pattern data is stored in the magnetic disk drive 109 of the inspection apparatus 100 as shown in FIG. 1. In a graphic pattern included in the pattern data, a rectangle or a triangle is used as a basic graphic pattern. Graphic data in which the shape, size, and position of each graphic pattern is stored in the magnetic disk drive 109. For example, the graphic data is information such as a coordinate (x, y) at a reference position of the graphic pattern, a side length, and a graphic code that is an identifier identifying a graphic pattern type such as a rectangle and a triangle.

The design intermediate data is converted into format data having a format that can be read by an electron beam lithography apparatus. Thereby, the inspection apparatus 100 can directly read the pattern writing data of the electron beam writing apparatus.

As shown in FIG. 1, the pattern generating circuit 111 reads the pattern data from the magnetic disk drive 109 through the control computer 110. Next, in the pattern generating circuit 111, the read pattern data is converted into binary or other multiple bit image data (design image data). Specifically, the pattern generating circuit 111 expands the pattern writing data to individual data of each graphic pattern, and interprets the graphic pattern code and graphic pattern dimension, which indicate the graphic pattern shape of the graphic pattern data. The pattern data is expanded into binary or other multiple bit image data of the pattern arranged in a square having a unit of a grid of a predetermined quantization dimension. Then, an occupancy rate of the graphic pattern in the design pattern is calculated in each region (square) corresponding to a sensor pixel, and the occupancy rate of the graphic pattern in each pixel becomes a pixel value.

The image data converted by the pattern generating circuit 111 is transmitted to the reference image generating circuit 112.

The reference image generating circuit 112 performs an appropriate filtering process to the pattern data, which is image data of the graphic. Thereby, reference image data is generated. The reason why this filtering process is performed is as follows.

In the production process, because roundness of a corner, and a finished dimension of the line width are adjusted, the pattern formed in the mask 101 is not strictly matched with the design pattern. The optical image data acquired by the sensor circuit 106 as shown in FIG. 1 is faint due to a resolution characteristic of the magnifying optical system 104, or an aperture effect of the photodiode array 105, in other words, the state in which a spatial low pass filter functions. Therefore, the mask 101 that is the inspection target is observed in advance of the inspection, a filter coefficient imitating the production process or a change of an optical system of the inspection apparatus 100 is determined to subject the pattern data to a two-dimensional digital filter. Thus, the processing of imitating the optical image data is performed to the reference image data.

A learning process of the filter coefficient may be performed using the pattern of the mask that becomes the reference determined in the mask production process, or a part of the pattern of the mask (mask 101 in the present embodiment) that is the inspection target. In the latter case, the filter coefficient is obtained in consideration of the pattern line width and a finished degree of the roundness of the corner of the region used in the learning process, and is used for a defect determination criterion of the whole mask.

It is advantageous in the case that the mask 101 that is the inspection target is used, as the learning process of the filter coefficient can be performed without removing influences such as a production variation and a fluctuation in the condition of the inspection apparatus 100. However, when the dimension fluctuates in the surface of the mask 101, the filter coefficient becomes optimum with respect to the position used in the learning process, but the filter coefficient does not necessarily become optimum with respect to other positions, which results in a pseudo defect. Therefore, preferably the learning process is performed around the center of the surface of the mask 101 that is hardly influenced by the fluctuation in dimension. Alternatively, the learning process is performed at multiple positions in the surface of the mask 101, and the average value of the obtained multiple filter coefficients may be used.

In addition to Step 1 to Step 8, the inspection method of the present embodiment further includes a process of detecting a defect of the graphic pattern of the mask 101 by comparing the optical image with the reference image. Besides the acquisition of the misplacement amount, the comparison circuit 108 detects a shape defect or a line width abnormality of the pattern of the mask 101 by performing die-to-database comparison between the optical image data and the reference image data generated from the design pattern data used to manufacture the mask 101. In addition, the misplacement amount acquisition circuit is positioned independently of the comparison circuit 108, and the comparison circuit 108 may perform only the defect detection by the die-to-database comparison.

The defect detection by a die-to-database comparison method in the comparison circuit 108 will be described below.

As described above, as the graphic pattern included in the pattern data, a basic shape, such as a rectangle or a triangle is used. For example, Graphic data in which the shape, size, and position of each graphic pattern is stored in the magnetic disk drive 109. For example, the graphic data is information such as a coordinate (x, y) at a reference position of the graphic pattern, a side length, and a graphic code that is an identifier identifying a graphic pattern type such as a rectangle and a triangle. Data hierarchized using a cluster (or cell) is arranged in the stripe, and the stripe is divided into proper sizes, and a sub-stripe is formed. The sub-stripe extracted from the optical image and the sub-stripe extracted from the reference image corresponding to the optical image are input to a comparison unit of the comparison circuit 108.

The sub-stripe input to the comparison circuit 108 is further divided into small rectangular regions called inspection frames. The comparison unit compares the inspection frames to each other to detect the defect. The comparison circuit 108 includes several tens of comparison units such that the plural inspection frames are concurrently processed. Each comparison unit captures the unprocessed frame image in sequence as soon as the processing of one inspection frame is ended. Thereby, the many inspection frames are sequentially processed.

Specifically, the processing of the comparison unit is performed as follows. Firstly, the optical image and the reference image are aligned with each other. In this case, in order that the edge positions of the patterns or the positions of brightness peaks are aligned with each other, the parallel shift is performed in units of pixels, and a proportional distribution of a brightness value of adjacent pixel is performed to align regions smaller than one pixel with each other. After the position alignment, the defect is detected according to a proper comparison algorithm by evaluating a level difference between the optical image and the reference image in each pixel, or comparing derivatives of the pixels in a pattern edge direction to each other. As the comparison result, in a case where the difference between both exceeds a defect determination threshold value, that point is determined as the defect. When determined as the defect, its coordinates, and the optical image data and the reference image data that is the basis of the defect determination are stored in the magnetic disk drive 109 as the inspection result.

As described above, according to the present embodiment, it is possible to reduce the local environmental fluctuation caused by the heat source or the irradiation of the inspection light and the fluctuation spread therefrom and applied to the inspection target. Furthermore, according to a method for correcting the measurement error, since it is also possible to reduce the measurement error caused by a non-local environmental fluctuation, it is possible to accurately measure the position coordinates of the inspection target, thereby performing an accurate inspection.

Second Embodiment

The inspection method according to the second embodiment of the present invention is an inspection method for performing inspection by measuring position coordinates of a sample that is an inspection target and uses, for example, a mask as the sample that is the inspection target, in the same way as the inspection method according to the first embodiment of the present invention. In particular, as the sample that is the inspection target, a mask used in EUV lithography is suitable. However, the inspection target is not limited to the mask. For example, a template used in nanoimprint lithography may be used, in the same way as the inspection method according to the first embodiment of the present invention.

As in the inspection method of FIG. 4 according to the first embodiment of the present invention, the inspection method of the second embodiment of the present invention includes the processes of Step 1 to Step 8, and for example, can be performed by performing the method for acquiring the optical image of the same mask as that described above using the inspection apparatus 100 of FIG. 1. However, according to the inspection method of the second embodiment of the present invention, in the Step 2 of grouping the stripe regions, the grouping of the stripe regions is performed in consideration of individual situations (for example, the temperature distribution of the mask). That is, the inspection method of the first embodiment of the present invention performs the grouping of the stripe regions uniformly as in the example of FIG. 3, but the inspection method of the second embodiment of the present invention performs the grouping of the stripe regions in consideration of the individual situations, for example, the temperature distribution of the mask.

With the exception of Step 2 of grouping the stripe regions includes different methods, the inspection method of the second embodiment of the present invention is the same as the above-described inspection method of the first embodiment of the present invention in the other processes, that is, Step 1 and Step 3 to Step 8. Therefore, the following description will focus on a difference of Step 2 of grouping the stripe regions in the inspection method of the second embodiment of the present invention, which differs from the above-described inspection method of the first embodiment of the present invention. The descriptions of the other processes of each Step common to the inspection method of the first embodiment of the present invention will be omitted.

The inspection method of the second embodiment of the present invention is illustrated in FIG. 4. After Step 1 of virtually dividing the inspection region of the mask 101 into the plurality of stripe regions, the stripe regions are grouped in consideration of the individual situations as described above in Step 2 of grouping the stripe regions.

In that case, it is preferable that the grouping of the Step 2 of FIG. 4 is performed according to, for example, the temperature distribution of the mask 101. In this case, in the inspection method of the second embodiment of the present invention, first, before the optical image is acquired, the temperature distribution of the mask 101 in the Y-direction is acquired by sequentially measuring the temperature from the end of the stripe region along the Y-direction in a state in which the mask 101 is placed on the stage 102. In this way, the temperature distribution of the mask 101 according to the positions on the stage 102 is obtained, regardless of the irradiation of the inspection light. The temperature is high at a position close to the heat source on the stage 102, and temperature is low at a position away from the heat source. Therefore, a temperature that is a threshold value is determined, and the grouping is performed at a boundary of the stripe regions that are higher or lower than the determined temperature. At this time, it is preferable that the temperature that is the threshold value is, for example, a temperature in the range between the set temperature of the inspection apparatus and $1 \times 10^{-1}$ K to $5 \times 10^{-1}$ K. However, the boundary divided according to the temperature that is the threshold value and the boundary of the stripe regions are not usually matched with each other. Therefore, it is preferable to perform the grouping as follows.

Figure 14:
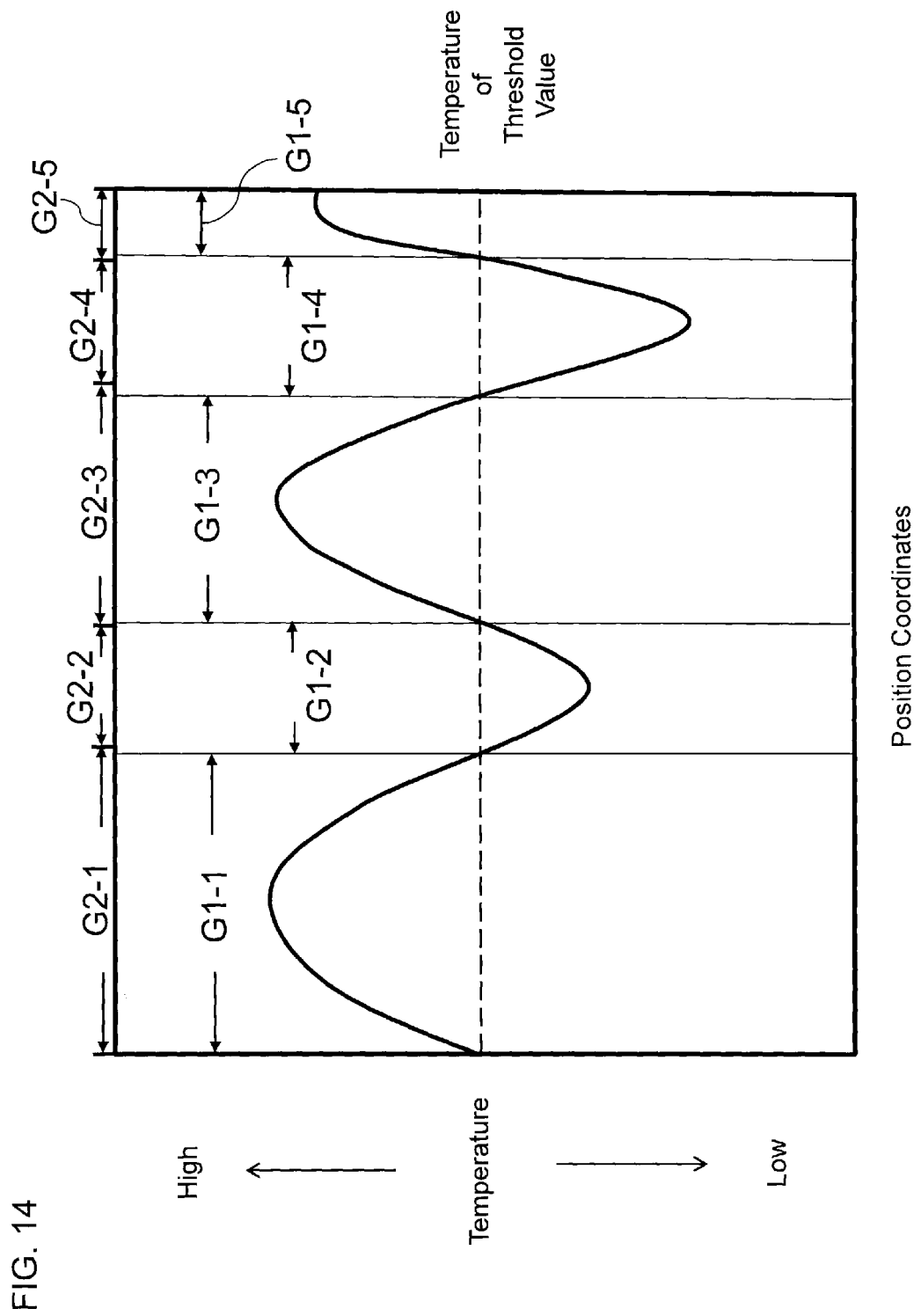
FIG. 14 illustrates an example in which the temperature distribution is measured in the Y-direction of the stripe region with respect to the inspection region of the mask positioned on the stage.

FIG. 14 illustrates an example in which the temperature distribution is measured in the Y-direction of the stripe region with respect to the inspection region of the mask 101 positioned on the stage 102. The temperature distribution is divided into primary groups G1-1 to G1-5 at a predetermined threshold temperature. That is, the inspection region is divided into the five groups G1-1 to G1-5. At this time, the boundary of the primary groups is not usually matched with the boundary of the stripe regions. Therefore, new groups (G2-1 to G2-5) can be generated by shifting the boundary of the primary groups to the boundary of the stripe regions arranged adjacent to each other, and the stripe regions can be divided by the new groups. At this time, an optimal number of stripe regions are included in each of the new groups (G2-1 to G2-5) so as to correspond to the temperature distribution of the mask 101, and the number of the stripe regions included in each group may be different.

After that, in the inspection method of the second embodiment of the present invention, the scanning order of the stripe regions by the inspection light is determined by the same Step 3 as the above-described inspection method of the first embodiment of the present invention. That is, after the scanning of a certain stripe region, the scanning order is determined such that a physically separated stripe region is scanned by selecting a stripe region of a group (or a sub-group) different from the group to which the scanned stripe region belongs.

More specifically, after an optical image of a graphic pattern arranged in a stripe region of one of the groups is acquired while moving the stage in the longitudinal direction of the stripe region, the stage is moved along the lateral direction of the stripe region up to a predetermined position of a different group from the corresponding group. Then, in the group of the movement destination, the optical image of the graphic pattern arranged in the stripe region not continuous to the stripe region whose optical image is acquired immediately before the movement in the lateral direction is acquired.

Alternatively, the optical image of the graphic pattern arranged within one stripe region in the sub-group of one group is acquired while moving the stage in the longitudinal direction of the stripe region, and the optical images of all the graphic patterns arranged within a predetermined number of stripe regions constituting the sub-group are acquired. After that, the stage is moved along the lateral direction of the stripe region up to a predetermined position in the sub-group of a different group from the corresponding group. Then, in the sub-group of the movement destination, the optical image of the graphic pattern arranged in the stripe region not continuous to the stripe region whose optical image is acquired immediately before the movement in the lateral direction is acquired.

Subsequently, the inspection method of the second embodiment of the present invention acquires the optical images of all the stripe regions by the same process of Step 4 as the above-described inspection method of the first embodiment of the present invention. After that, as illustrated in FIG. 4, the same processes of Step 5 to Step 8 as the above-described inspection method of the first embodiment of the present invention are performed to acquire information of the accurate misplacement amount of the pattern of the mask 101 (fourth misplacement information).

In addition to Step 1 to Step 8, the inspection method of the present embodiment further includes a process of detecting a defect of the graphic pattern of the mask 101 by comparing the optical image with the reference image. In addition, the inspection method of the present embodiment can include a process of generating a map in which the misplacement amount between the optical image and the reference image corresponds to the position coordinates on the mask 101 using the fourth misplacement information. These are all the same as the processes described in the first embodiment.

Therefore, the inspection method of the second embodiment of the present invention can reduce the influence of the thermal expansion or the temperature increase of air around the mask and can perform inspection by more accurately measuring the position coordinates of the sample that is the inspection target.

Third Embodiment

The inspection method according to the third embodiment of the present invention is an inspection method for performing inspection by measuring position coordinates of a sample that is an inspection target and uses, for example, a mask as the sample that is the inspection target, in the same way as the inspection methods according to the first embodiment and the second embodiment of the present invention. In particular, as the sample to be used as the inspection target, a mask used in EUV lithography is suitable. However, the inspection target is not limited to the mask. For example, a template used in nanoimprint lithography may be used, in the same way as the inspection methods according to the first embodiment and the second embodiment of the present invention.

In the same way as the inspection method according to the first embodiment of the present invention as shown in FIG. 4, the inspection method of the third embodiment of the present invention includes the processes of Step 1 to Step 8, and for example, can be performed using the inspection apparatus 100 of FIG. 1.

In the inspection method of the first embodiment of the present invention, as in the examples of FIGS. 3 and 12, after the scanning of a certain stripe region by the inspection light is completed, the scanning order is determined to prevent the adjacent stripe regions from being continuously scanned.

That is, the scanning order is determined by selecting the stripe region of a group (or a sub-group) different from the group to which the scanned stripe region belongs, so as to scan the stripe region physically separated from the stripe region on which the scanning of the inspection light has been completed. As such, after the scanning of one stripe region is completed, the scanning order is determined to scan a stripe region arranged at a position physically separated from the scanned stripe region. Therefore, it is possible to perform the position measurement in a state in which the thermal influence by the heat source is reduced.

However, for example, even though the adjacent stripe regions are continuously scanned, the temperature increase in these stripe regions is relatively slow. In such a case, if there is no trouble in the measurement of the position coordinates of the pattern of the mask 101, after continuously scanning the plurality of adjacent stripe regions within one group, the scanning can be moved to a different group and the plurality of adjacent stripe regions within the group can be scanned. According to this method, the optical image can be acquired efficiently in terms of time, as compared to the method of scanning the stripe regions by moving to another group whenever one stripe region is scanned.

Therefore, in the inspection method of the third embodiment of the present invention, even when the adjacent stripe regions are scanned by the inspection light, the plurality of adjacent stripe regions within one group can be scanned in a case where the temperature increase in these stripe regions is relatively slow and there is no trouble in the measurement of the position coordinates of the pattern of the mask 101. Then, after moving to a different group, the plurality of adjacent stripe regions within the corresponding group is scanned.

That is, in Step 3, the inspection method of the third embodiment of the present invention determines the scanning order of the stripe regions by the inspection light, so as to continuously scan the plurality of adjacent stripe regions within one group, within the range in which the temperature increase caused by the scanning of the stripe region by the inspection light gives no obstacle to the measurement of the position coordinates of the pattern of the mask 101.

Subsequently, in Step 4, the optical image of the pattern of the mask 101 is acquired by scanning the stripe region in the order determined in Step 3. A timing of moving the group at this time can be, for example, a timing when the scanning of a predetermined number of stripe regions is completed. In this case, the "predetermined number" is equal to or greater than 1 and is equal to or less than a total number of stripe regions constituting the group. In the example of FIG. 13, a timing of moving from the group G1 to the group G2 can be, for example, a timing when the optical images of all patterns are acquired in the stripe regions (S1, S2) constituting one sub-group SG1 in the group G1. Such a timing can be determined in Step 3 together with the determination of the scanning order.

In the inspection method according to the third embodiment of the present invention, Step 1, Step 2, and Step 5 to Step 8 are the same as the above-mentioned inspection method according to the first embodiment of the present invention. However, in the inspection method according to the third embodiment, Step 3 and Step 4 include the different methods to the inspection method according to the first embodiment. Therefore, the following description will focus on a difference between Step 3 and Step 4 in the inspection method of the third embodiment of the present invention, which differs from the above-described inspection method of the first embodiment of the present invention. The descriptions of the other processes of each Step common to the inspection method of the first embodiment of the present invention will be omitted.

In the inspection method of the third embodiment of the present invention, after Step 1 of virtually dividing the inspection region of the mask 101 into the plurality of stripe regions, the stripe regions are grouped in Step 2, in the same way as the inspection method according to the first embodiment as shown in FIG. 4. At this time, the grouping can be performed uniformly as in the example of FIG. 3.

In Step 4 following Step 3, the scanning order of the stripe regions by the inspection light is determined. Subsequently, in Step 4, the stripe region is scanned in the order determined in Step 3, and the optical image of the pattern of the mask 101 is acquired.

At this time, in Step 3, the inspection method of the third embodiment of the present invention can determine the scanning order such that, even when the adjacent stripe regions are scanned, the plurality of adjacent stripe regions within one group can be scanned in a case where the temperature increase in these stripe regions is relatively slow and there is no trouble in the measurement of the position coordinates of the pattern of the mask 101, and after moving to a different group, the plurality of adjacent stripe regions within the corresponding group is scanned. In Step 4, the optical images of all the stripe regions are acquired by repeating the following processes (1) and (2) according to the order determined in Step 3.

Specifically, the movement to the different group is performed as follows. After the optical image of the graphic pattern arranged within the stripe region in one of the groups is acquired while moving the stage in the longitudinal direction of the stripe region, the stage is moved along the lateral direction of the stripe region up to a predetermined position of a different group from this group. Then, in the group of the movement destination, the optical image of the graphic pattern arranged in the stripe region not continuous to the stripe region whose optical image is acquired immediately before the movement in the lateral direction is acquired.

(1) The optical image of the pattern arranged within the stripe region in one group determined in Step 2 is acquired while moving the stage 102 in the X-direction (or the −X-direction). After that, by moving the stage 102 in the −Y-direction, the optical image of the pattern within the stripe region adjacently arranged in the same group may be acquired. The optical image of the pattern within three stripe regions or more than three stripe regions in the same group may also be acquired by repeating the same process, that is, acquiring the optical image of the pattern within the adjacent stripe region.

(2) Next, by moving the stage 102 in the −Y-direction, the optical image of the pattern arranged within a stripe region in a different group from the group in which the optical image has been acquired in (1) is acquired while moving the stage 102 in the X-direction (or the −X-direction). After that, by moving the stage 102 in the −Y-direction, the optical image of the pattern within the stripe region adjacently arranged in the same group may be acquired. The optical image of the pattern within three stripe regions or more than three stripe regions in the same group may also be acquired by repeating the same process such as the optical image of the pattern within the adjacent stripe region.

In Step 4, a timing of moving the group (determined in Step 2) can be, for example, a timing when the scanning of a predetermined number of stripe regions is completed, according to the scanning order determined in Step 3.

As described above, the same predetermined number may be applied to each group, but the temperature change during the scanning may be measured by a sensor or the like and it is possible to move to another group when reaching a predetermined temperature, according to the scanning order determined in Step 3 and the moving timing. More specifically, the temperature of the stripe region at the exact time the optical image of the stripe region is acquired is measured together with the acquisition of the optical image, and it is possible to move the group when the measured temperature reaches a predetermined value. For example, the threshold temperature is determined and it is possible to move the group when the measured temperature reaches the threshold temperature. At this time, it is preferable that the temperature that is the threshold value is, for example, a temperature in the range between the set temperature of the inspection apparatus and $1 \times 10^{-1}$K to $5 \times 10^{-1}$K.

Alternatively, the time until the measured temperature reaches a predetermined temperature is previously obtained from the relationship between the scanning time and the temperature, and it is possible to move to another group when the scanning time reaches the above-described time, according to the determination of the scanning order in Step 3. For example, in the example of FIG. 3, while measuring the temperature, the stripe regions are scanned in the order of S1, S2, S3, ..., and S10. Then, the relationship between the time elapsed from the start of the scanning of the first stripe region Si and the temperature at the exact time the optical image of the scanned stripe region is acquired. In addition, this relationship is acquired before Step 4. Since the temperature of the stripe region scanned when the predetermined time has elapsed from the acquisition of the first optical image can be previously known, the group is moved to the position where the time corresponding to the predetermined temperature that is the threshold value has elapsed, according to the determination of the scanning order in Step 3. At this time, it is preferable that the predetermined temperature is, for example, a temperature in the range between the set temperature of the inspection apparatus and 1×10–1K to 5×10–1K.

In either case, the movement to another group is specifically performed as follows. After the optical image of the graphic pattern arranged within the stripe region in one of the groups is acquired while moving the stage in the longitudinal direction of the stripe region, the stage is moved along the lateral direction of the stripe region up to a predetermined position of a different group from this group. Then, in the group of the movement destination, the optical image of the graphic pattern arranged in the stripe region not continuous to the stripe region whose optical image is acquired immediately before the movement in the lateral direction is acquired.

Since the inspection method of the third embodiment of the present invention includes the above-described Step 3 and Step 4, it is possible to efficiently acquire the optical image in terms of time, reduce the influence of the thermal expansion or the temperature increase of air around the mask, and accurately measure the position coordinates of the mask 101 that is the inspection target. Therefore, the information of the accurate misplacement amount of the pattern of the mask 101 (fourth misplacement information) is obtained.

In addition to Step 1 to Step 8, the inspection method of the present embodiment further includes a process of detecting a defect of the graphic pattern of the mask 101 by comparing the optical image with the reference image. In addition, the inspection method of the present embodiment can include a process of generating a map in which the misplacement amount between the optical image and the reference image corresponds to the position coordinates on the mask 101 using the fourth misplacement information. These are all the same as the processes described in the first embodiment.

The present invention is not limited to the above-mentioned embodiments and can be implemented in various ways without departing from the spirit of the invention.

In the above-mentioned embodiments, the inspection by the die-to-database comparison method, as one example, has been described, but the present invention is not limited thereto. For example, in a case where a plurality of chips having the same pattern configuration is arranged in the partial or entire mask, the inspection may be performed by a method of comparing the same patterns of different chips of the mask (die-to-die comparison method). In addition, in the case of patterns below an optical resolution limit, the inspection can also be performed by a method of comparing a pixel of interest within one image with an adjacent pixel thereof.

The above description of the present embodiment has not specified apparatus constructions, control methods, etc., which are not essential to the description of the invention, since any suitable apparatus construction, control methods, etc. can be employed to implement the invention. Further, the scope of this invention encompasses all inspection methods employing the elements of the invention and variations thereof, which can be designed by those skilled in the art.

What is claimed is:
1. An inspection method comprising:
placing a sample, in which a plurality of graphic patterns are arranged, on a stage of an inspection apparatus;
dividing an inspection region of the sample into a plurality of stripe regions, and dividing the inspection region into a plurality of groups so that a plurality of continuously arranged stripe regions constitutes one group;
acquiring optical images of graphic patterns arranged in all stripe regions while measuring position coordinates of the stage using a laser interferometer, wherein the step for acquiring optical images comprises
acquiring an optical image of a graphic pattern arranged in a stripe region of one of the groups while moving the stage in a longitudinal direction of the stripe region,
moving the stage in a lateral direction of the stripe region, and
acquiring an optical image of a graphic pattern arranged in a stripe region of a group different from one of the groups in which the optical image is acquired, and in a stripe region not continuous to the stripe region whose optical image is acquired immediately before the movement in the lateral direction while moving the stage in the longitudinal direction of the stripe region;
obtaining the position coordinates of the graphic pattern from a measurement value of the position coordinates of the stage, the optical image of the graphic pattern, and a reference image generated from design data of the graphic pattern, obtaining a misplacement amount between the optical image and the reference image based on the position coordinates of the graphic pattern, and obtaining first misplacement information of a relationship between the misplacement amount and an acquiring order of the optical images;

obtaining second misplacement information that is an approximate curve of the first misplacement information;

obtaining third misplacement information that is a difference between the first misplacement information and the second misplacement information; and obtaining fourth misplacement information of a relationship between a misplacement amount in the third misplacement information and design position coordinates obtained from the design data.

2. The inspection method according to claim 1, wherein each of the stripe regions are grouped in a predetermined number to constitute sub-groups, and wherein the step for acquiring optical images of graphic patterns arranged in all stripe regions while measuring position coordinates of the stage using a laser interferometer, comprises:

acquiring an optical image of a graphic pattern arranged within one stripe region in the sub-group of one of the groups while moving the stage in the longitudinal direction of the stripe region, moving the stage in the lateral direction of the stripe region, after optical images of all graphic patterns arranged within a predetermined number of stripe regions constituting the sub-group are acquired, and acquiring the optical image of the graphic pattern arranged in one stripe region in the sub-group of a group different from the group in which the optical image is acquired, and in the stripe region not continuous to the stripe region whose optical image is acquired immediately before the movement in the lateral direction while moving the stage in the longitudinal direction of the stripe region.

3. The inspection method according to claim 1, wherein the misplacement amount in the obtaining step of the first misplacement information is a value at which an absolute value of a difference value between the optical image and the reference image, or the sum of squares of a difference between the optical image and the reference image, is minimized.

4. The inspection method according to claim 1, further comprising generating a map in which the misplacement amount between the optical image and the reference image corresponds to the position coordinates on the sample using the fourth misplacement information.

5. The inspection method according to claim 1, further comprising detecting a defect of the graphic pattern by comparing the optical image with the reference image.

6. The inspection method according to claim 1, wherein the sample is a mask used in EUV lithography.

7. An inspection method comprising:

placing a sample, in which a plurality of graphic patterns are arranged, on a stage of an inspection apparatus;

dividing an inspection region of the sample into a plurality of stripe regions, and dividing the inspection region into a plurality of groups so that a plurality of continuously arranged stripe regions constitutes one group;

acquiring optical images of graphic patterns arranged in all stripe regions while measuring the position coordinates of the stage using a laser interferometer and measuring a temperature of the stripe region, wherein the step for acquiring optical images comprises acquiring an optical image of a graphic pattern arranged in a stripe region of one of the groups while moving the stage in a longitudinal direction of the stripe region, moving the stage in a lateral direction of the stripe region when the temperature of the stripe region reaches a predetermined temperature, and acquiring an optical image of a graphic pattern arranged in a stripe region of a group different from one of the groups in which the optical image is acquired, and in a stripe region not continuous to the stripe region whose optical image is acquired immediately before the movement in the lateral direction while moving the stage in the longitudinal direction of the stripe region;

obtaining the position coordinates of the graphic pattern from a measurement value of the position coordinates of the stage, the optical image of the graphic pattern, and a reference image generated from design data of the graphic pattern, obtaining a misplacement amount between the optical image and the reference image based on the position coordinates of the graphic pattern, and obtaining first misplacement information of a relationship between the misplacement amount and an acquiring order of the optical images;

obtaining second misplacement information that is an approximate curve of the first misplacement information;

obtaining third misplacement information that is a difference between the first misplacement information and the second misplacement information; and obtaining fourth misplacement information of a relationship between a misplacement amount in the third misplacement information and design position coordinates obtained from the design data.

8. The inspection method according to claim 7, wherein the misplacement amount in the obtaining step of the first misplacement information is a value at which an absolute value of a difference value between the optical image and the reference image, or the sum of squares of a difference between the optical image and the reference image, is minimized.

9. The inspection method according to claim 7, further comprising generating a map in which the misplacement amount between the optical image and the reference image corresponds to the position coordinates on the sample using the fourth misplacement information.

10. The inspection method according to claim 7, further comprising detecting a defect of the graphic pattern by comparing the optical image with the reference image.

11. The inspection method according to claim 7, wherein the sample is a mask used in EUV lithography.

12. An inspection method comprising:

placing a sample, in which a plurality of graphic patterns are arranged, on a stage of an inspection apparatus;

dividing an inspection region of the sample into a plurality of stripe regions, and dividing the inspection region into a plurality of groups so that a plurality of continuously arranged stripe regions constitutes one group;

acquiring an optical image of a graphic pattern arranged in one stripe region while measuring the temperature of the stripe region, moving the stage in a lateral direction of the stripe region, acquiring an optical image of a graphic pattern arranged in a stripe region continuous to the stripe region while measuring the temperature of the stripe region, and obtaining a relationship between a time elapsed from the acquisition of the first optical image and a temperature of the stripe region, at the exact time the optical image of the stripe region is acquired;

acquiring optical images of graphic patterns arranged in all stripe regions while measuring position coordinates of the stage using a laser interferometer, wherein the step for acquiring optical images comprises acquiring an optical image of a graphic pattern arranged in a stripe region in one of the groups until reaching a time when the temperature of the stripe region, at the exact time the optical image of the stripe region is acquired, reaches a predetermined value, moving the stage in the lateral direction of the stripe region, acquiring an optical image of a graphic pattern arranged in a stripe region continuous to the stripe region, moving the stage in the lateral direction of the stripe region when a time that the temperature of the stripe region, at the exact time the optical image of the stripe region is acquired, reaches a predetermined value elapses, and acquiring an optical image of a graphic pattern arranged in a stripe region of a group different from one of the groups in which the optical image is acquired, and in a stripe region not continuous to the stripe region whose optical image is acquired immediately before the movement in the lateral direction while moving the stage in the longitudinal direction of the stripe region;

obtaining the position coordinates of the graphic pattern from a measurement value of the position coordinates of the stage, the optical image of the graphic pattern, and a reference image generated from design data of the graphic pattern, obtaining a misplacement amount between the optical image and the reference image based on the position coordinates of the graphic pattern, and obtaining first misplacement information of a relationship between the misplacement amount and an acquiring order of the optical images;

obtaining second misplacement information that is an approximate curve of the first misplacement information;

obtaining third misplacement information that is a difference between the first misplacement information and the second misplacement information; and obtaining fourth misplacement information of a relationship between a misplacement amount in the third misplacement information and design position coordinates obtained from the design data.

13. The inspection method according to claim 12, wherein the misplacement amount in the obtaining step of the first misplacement information is a value at which an absolute value of a difference value between the optical image and the reference image, or the sum of squares of a difference between the optical image and the reference image, is minimized.

14. The inspection method according to claim 12, further comprising generating a map in which the misplacement amount between the optical image and the reference image corresponds to the position coordinates on the sample using the fourth misplacement information.

15. The inspection method according to claim 12, further comprising detecting a defect of the graphic pattern by comparing the optical image with the reference image.

16. The inspection method according to claim 12, wherein the sample is a mask used in EUV lithography.

17. An inspection method comprising:

placing a sample, in which a plurality of graphic patterns are arranged, on a stage of an inspection apparatus;

measuring a temperature distribution in a lateral direction with respect to a plurality of stripe regions obtained by virtually dividing an inspection region of the sample placed on the stage;

dividing the temperature distribution into primary groups at a predetermined threshold temperature, generating new groups by shifting a boundary of the primary groups to a boundary of stripe regions positioned adjacent to each other, thereby dividing the stripe regions into the new groups;

acquiring optical images of graphic patterns arranged in all stripe regions while measuring position coordinates of the stage using a laser interferometer, wherein the step for acquiring optical images comprises acquiring an optical image of a graphic pattern arranged in a stripe region of one of the groups while moving the stage in a longitudinal direction of the stripe region, moving the stage in a lateral direction of the stripe region, and acquiring an optical image of a graphic pattern arranged in a stripe region of a group different from one of the groups in which the optical image is acquired, and in a stripe region not continuous to the stripe region whose optical image is acquired immediately before the movement in the lateral direction while moving the stage in the longitudinal direction of the stripe region;

obtaining the position coordinates of the graphic pattern from a measurement value of the position coordinates of the stage, the optical image of the graphic pattern, and a reference image generated from design data of the graphic pattern, obtaining a misplacement amount between the optical image and the reference image based on the position coordinates of the graphic pattern, and obtaining first misplacement information of a relationship between the misplacement amount and an acquiring order of the optical images;

obtaining second misplacement information that is an approximate curve of the first misplacement information;

obtaining third misplacement information that is a difference between the first misplacement information and the second misplacement information; and obtaining fourth misplacement information of a relationship between a misplacement amount in the third misplacement information and design position coordinates obtained from the design data.

18. The inspection method according to claim 17, wherein the misplacement amount in the obtaining step of the first misplacement information is a value at which an absolute value of a difference value between the optical image and the reference image, or the sum of squares of a difference between the optical image and the reference image, is minimized.

19. The inspection method according to claim 17, further comprising generating a map in which the misplacement amount between the optical image and the reference image corresponds to the position coordinates on the sample using the fourth misplacement information.

20. The inspection method according to claim 17, further comprising detecting a defect of the graphic pattern by comparing the optical image with the reference image.

* * * * *